(12) United States Patent
Ryu et al.

(10) Patent No.: US 8,994,222 B2
(45) Date of Patent: Mar. 31, 2015

(54) APPARATUS FOR RADIATIVE WIRELESS POWER TRANSMISSION AND WIRELESS POWER RECEPTION

(75) Inventors: Young Ho Ryu, Yongin-si (KR); Eun Seok Park, Suwon-si (KR); Sang Wook Kwon, Seongnam-si (KR); Jung Hae Lee, Seoul (KR); Jae Hyun Park, Seoul (KR); Byung Chul Park, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 915 days.

(21) Appl. No.: 13/178,100

(22) Filed: Jul. 7, 2011

(65) Prior Publication Data

US 2012/0049643 A1 Mar. 1, 2012

(30) Foreign Application Priority Data

Aug. 24, 2010 (KR) .................. 10-2010-0082110

(51) Int. Cl.
| | |
|---|---|
| *H01F 27/42* | (2006.01) |
| *H01F 37/00* | (2006.01) |
| *H01F 38/00* | (2006.01) |
| *H04B 5/00* | (2006.01) |
| *H02J 5/00* | (2006.01) |

(52) U.S. Cl.
CPC ............ H04B 5/0037 (2013.01); H02J 5/005 (2013.01)
USPC ........................................ 307/104

(58) Field of Classification Search
CPC ........... H01F 38/14; H02J 17/00; H02J 5/005; H02J 7/025; H04B 5/0075
USPC ............................................. 307/104; 320/108
See application file for complete search history.

(56) References Cited

U.S. PATENT DOCUMENTS

| | | |
|---|---|---|
| 2008/0204327 A1 | 8/2008 | Lee et al. |
| 2009/0051224 A1 | 2/2009 | Cook et al. |
| 2009/0072629 A1 | 3/2009 | Cook et al. |
| 2009/0079268 A1 | 3/2009 | Cook et al. |
| 2010/0033021 A1 | 2/2010 | Bennett |
| 2010/0034238 A1 | 2/2010 | Bennett |
| 2010/0036773 A1 | 2/2010 | Bennett |
| 2011/0095618 A1* | 4/2011 | Schatz et al. .................. 307/104 |

(Continued)

FOREIGN PATENT DOCUMENTS

| | | |
|---|---|---|
| JP | 2003-051710 | 2/2003 |
| JP | 2009-253762 | 10/2009 |

(Continued)

*Primary Examiner* — Carlos Amaya
(74) *Attorney, Agent, or Firm* — NSIP Law

(57) ABSTRACT

Provided is an apparatus that may control a direction of wireless power transmission. A radiative wireless power transmitter may include at least two first unit resonators to form a magnetic field with a target resonator based on an x-axis direction and a z-axis direction, and to transmit a resonance power to the target resonator, at least two second unit resonators to form a magnetic field with the target resonator based on the x-axis direction and a y-axis direction, and to transmit a resonance power to the target resonator, at least two third unit resonators to form a magnetic field with the target resonator based on the y-axis direction and the z-axis direction, and to transmit a resonance power to the target resonator, and a feeding unit to control resonance power transmission of the at least two first unit resonators, the at least two second unit resonators, and the at least two third unit resonators.

15 Claims, 15 Drawing Sheets

(56) References Cited

U.S. PATENT DOCUMENTS

2011/0210621 A1* 9/2011 Iwaisako et al. .............. 307/104
2012/0001497 A1* 1/2012 Sada et al. .................... 307/104

FOREIGN PATENT DOCUMENTS

JP   2009-273213      11/2009
KR   10-2009-0050912   5/2009

* cited by examiner

APPARATUS FOR RADIATIVE WIRELESS POWER TRANSMISSION AND WIRELESS POWER RECEPTION

CROSS-REFERENCE TO RELATED APPLICATION(S)

This application claims the benefit under 35 U.S.C. §119(a) of Korean Patent Application No. 10-2010-0082110, filed on Aug. 24, 2010, in the Korean Intellectual Property Office, the entire disclosure of which is incorporated herein by reference for all purposes.

BACKGROUND

1. Field

The following description relates to an apparatus that may control a direction of wireless power transmission and wireless power reception.

2. Description of Related Art

Demand for electric devices including portable devices has rapidly increased. Typically, portable electric devices are supplied power via a wired power supply, which can be inconvenient to a user. Studies on wireless power transmission have been conducted to overcome the inconvenience in wired power supply and a limited capacity of a conventional battery.

One example of wireless power transmission scheme uses a characteristic of resonance of radio frequency (RF) devices. A wireless power transmission system based on the characteristic of resonance may include a source that supplies the power and a target that receives the power. An efficiency of the power transmission may vary based on whether the source and the target are placed in parallel or in orthogonal. Accordingly, in a multi-device system, an efficiency of power transmission of each device may be different based on a location and a direction of a corresponding device.

SUMMARY

A radiative wireless power transmitter, including at least two first unit resonators to form a magnetic field with a target resonator based on an x-axis direction and a z-axis direction, and to transmit a resonance power to the target resonator, at least two second unit resonators to form a magnetic field with the target resonator based on the x-axis direction and a y-axis direction, and to transmit a resonance power to the target resonator, at least two third unit resonators to form a magnetic field with the target resonator based on the y-axis direction and the z-axis direction, and to transmit a resonance power to the target resonator, and a feeding unit to control resonance power transmission of the at least two first unit resonators, the at least two second unit resonators, and the at least two third unit resonators.

The feeding unit may comprise a first matcher that is placed in a plane that is parallel with the at least two first unit resonators and that enables the at least two first unit resonators to form the magnetic field with the target resonator, a second matcher that is placed in a plane that is parallel with at least two second unit resonators and that enables the at least two second unit resonators to form the magnetic field with the target resonator, and a third matcher that is placed in parallel with the at least two third unit resonators and that enables the at least two third unit resonators to form the magnetic field with the target resonator.

The feeding unit may control a predetermined matcher from among the first matcher, the second matcher, and the third matcher, to enable wireless power transmission to be performed in a predetermined direction.

The at least two first unit resonators, the at least two second unit resonators, and the at least two third unit resonators may each comprise a transmission line that comprises a first signal conducting portion, a second signal conducting portion, and a ground conducting portion corresponding to the first signal conducting portion and the second signal conducting portion, a first conductor that is electrically connected to the first signal conducting portion and the ground conducting portion, a second conductor that is electrically connected to the second signal conducting portion and the ground conducting portion, and at least one capacitor inserted between the first signal conducting portion and the second signal conducting portion in series with respect to a current flowing through the first signal conducting porting and the second signal conducting portion.

The radiative wireless power transmitter may further comprise a controller to generate a control signal to control the resonance power transmission of the at least two first unit resonators, the at least two second unit resonators, and the at least two third unit resonators, and to generate a control signal to control impedances of the at least two first unit resonators, the at least two second unit resonators, and the at least two third unit resonators.

The at least two first unit resonators, the at least two second unit resonators, and the at least two third unit resonators may each be in the shape of a square, and the at least two first unit resonators, the at least two second unit resonators, and the at least two third unit resonators may be connected with each other to form a shape of a hexahedron.

The first matcher, the second matcher, and the third matcher may each be in the shape of a square.

In another aspect, there is provided a radiative wireless power transmitter, including a first unit resonator that is placed in a plane that is parallel to a direction of an x-axis and a z-axis, forming a magnetic field with a target resonator, and transmitting resonance power to the target resonator, a second unit resonator that is placed in a plane that is parallel to a direction of the x-axis and a y-axis, forming a magnetic field with the target resonator, and transmitting resonance power to the target resonator, a third unit resonator that is placed in a plane that is parallel to a direction of the y-axis and the z-axis, forming a magnetic field with the target resonator, and transmitting resonance power to the target resonator, and a feeding unit to control resonance power transmission of the first unit resonator, the second unit resonator, and the third unit resonator.

The feeding unit may comprise a first matcher included in the first unit resonator and configured to enable the first unit resonator to form the magnetic field with the target resonator, a second matcher included in the second unit resonator and configured to enable the second unit resonator to form the magnetic field with the target resonator, and a third matcher included in the third unit resonator and configured to enable the third unit resonators to form the magnetic field with the target resonator.

The feeding unit may control a predetermined matcher from among the first matcher, the second matcher, and the third matcher, to enable wireless power transmission to be performed in a predetermined direction.

Each of the first unit resonator, the second unit resonator, and the third unit resonator may be in the shape of a circle, and the first unit resonator, the second unit resonator, and the third unit resonator may be connected with each other to form a shape of a sphere.

Each of the first matcher, the second matcher, and the third matcher may be in the shape of a circle.

The radiative wireless power transmitter may further comprise a controller to generate a control signal to control the resonance power transmission of the first unit resonator, the second unit resonator, and the third unit resonator, and to generate a control signal to control impedances of the first unit resonator, the second unit resonator, and the third unit resonator.

In another aspect, there is provided a radiative wireless power receiver, including at least two first unit resonators to form a magnetic field with a source resonator based on an x-axis direction and z-axis direction, and to receive resonance power from the source resonator, at least two second unit resonators to form a magnetic field with the source resonator based on the x-axis direction and a y-axis direction, and to receive resonance power from the source resonator, at least two third unit resonators to form a magnetic field with the source resonator based on the y-axis direction and the z-axis direction, and to receive resonance power from the source resonator, and a feeding unit to control resonance power reception of the at least two first unit resonators, the at least two second unit resonators, and the at least two third unit resonators.

The feeding unit may control a predetermined matcher from among the first matcher, the second matcher, and the third matcher, to enable wireless power reception to be performed in a predetermined direction.

The radiative wireless power receiver may further comprise a detector to detect at least one of a distance between a wireless power transmission resonator and a wireless power reception resonator, a reflection coefficient of a wave emitted from the wireless power transmission resonator to the wireless power reception resonator, a power transmission gain between the wireless power transmission resonator and the wireless power reception resonator, and a coupling efficiency.

In another aspect, there is provided a radiative wireless power receiver, including a first unit resonator that is placed in a plane that is parallel to a direction of an x-axis and a z-axis, forming a magnetic field with a source resonator, and receiving resonance power from the source resonator, a second unit resonator that is placed in a plane that is parallel to a direction of the x-axis and a y-axis, forming a magnetic field with the source resonator, and receiving resonance power from the source resonator, a third unit resonator that is placed in a plane that is parallel to a direction of the y-axis and the z-axis, forming a magnetic field with the source resonator, and receiving resonance power from the source resonator, and a feeding unit to control resonance power reception of the first unit resonator, the second unit resonator, and the third unit resonator.

In another aspect, there is provided a resonator for wireless power transmission, the resonator including a first resonating unit positioned in an XZ plane and configured to transmit/receive power wirelessly in a direction that is vertical to the XZ plane and that is parallel to the y-axis, a second resonating unit positioned in an XY plane and configured to transmit/receive power wirelessly in a direction that is vertical to the XY plane and that is parallel to the z-axis, and a first resonating unit positioned in a YZ plane and configured to transmit/receive power wirelessly in a direction that is vertical to the YZ plane and that is parallel to the y-axis.

The resonator may further comprise a first matcher that is positioned in the XZ plane along a transmission path of the first resonating unit, a second matcher that is positioned in the XY plane along a transmission path of the second resonating unit, and a third matcher that is positioned in the YZ plane along a transmission path of the third resonating unit, wherein the first matcher, the second matcher, and the third matcher control a respective resonating unit to enable the respective resonating unit to perform magnetic coupling with a target device.

Other features and aspects may be apparent from the following detailed description, the drawings, and the claims.

Figure 1:
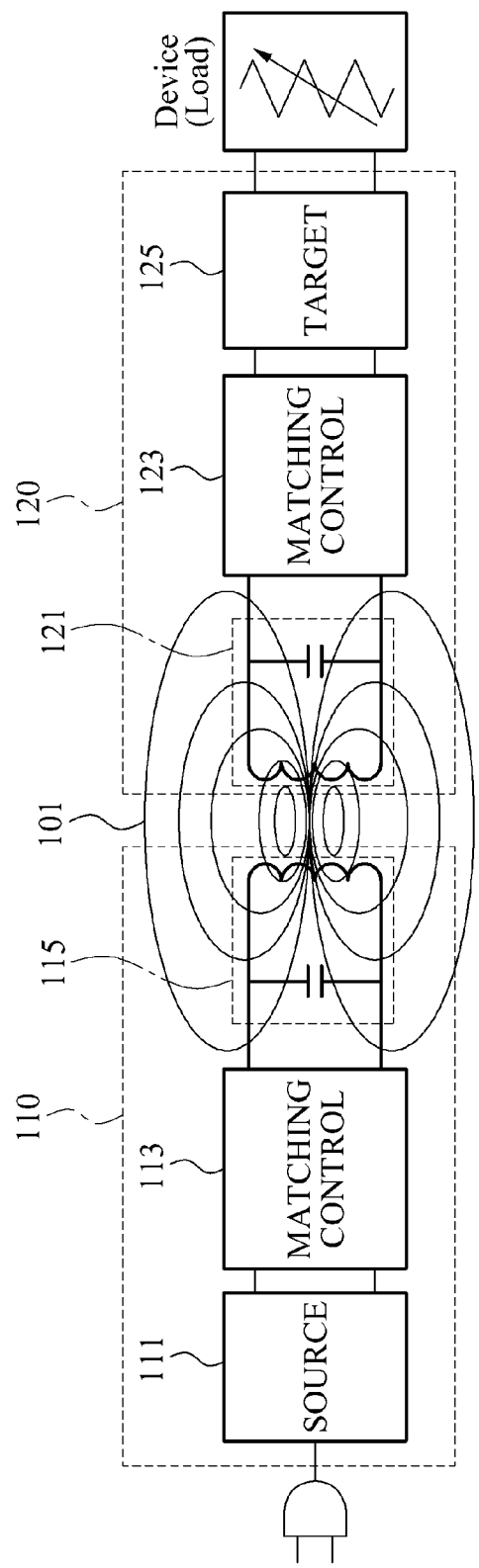
FIG. 1 is a diagram illustrating an example of a wireless power transmission system.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, descriptions of well-known functions and constructions may be omitted for increased clarity and conciseness.

The following description is related to a wireless power transmission technology that may be used by a wireless power transmission system. The wireless power transmission technology may be classified into a plurality of schemes, for example, an electromagnetic induction scheme, a radio wave reception scheme, a resonance scheme, and the like.

For example, in the electromagnetic induction scheme, if two coils are close enough to each other, and an alternating current is flowing through one of the coils, a magnetic flux may be generated and an electromotive force may be induced in the other coil. The electromagnetic induction scheme may be based on the above-described phenomenon. For purposes of example, the electromagnetic induction scheme may have approximately 60% to 98% efficiency in using power. As a result, the electromagnetic induction is relatively efficient and practical.

As another example, in the radio wave reception scheme radio wave energy may be received via an antenna and may obtain power by converting a waveform of alternating radio waves into direct current (DC), for example, using a rectifier circuit. For example, the radio wave reception scheme may perform wireless power transmission over several meters.

As another example, the resonance scheme may be based on a resonance of an electric field or a magnetic field. The resonance scheme may transmit energy between devices, wherein the transmission of energy is resonated at the same frequency. For example, if the resonance of the magnetic field is used, which is referred to as a magnetic resonance scheme, power may be generated through a magnetic resonance coupling that utilizes a structure of an LC resonator.

The magnetic resonance scheme may use a near field effect over a relatively short distance as compared with a wavelength of a used frequency. In this example, the magnetic resonance scheme may be a non-radiative energy transmission that is different from the radio wave reception scheme. The magnetic resonance scheme may match resonance frequencies of a transmitter and a receiver to transmit power. For purpose of example, the efficiency of the magnetic resonance scheme in using power may increase by approximately 50% to 60%, which is relatively higher than the radio wave reception scheme emitting an electromagnetic wave.

For example, the distance between the transmitter and the receiver of the magnetic resonance scheme may be about several meters, which is a relatively closer distance as compared with the radio wave reception scheme. However, the magnetic resonance scheme may be capable of transmitting power over a relatively long distance as compared with the electromagnetic induction scheme.

As described herein, for example, the source or transmitter may be, or may be included in, a terminal, such as a mobile terminal, a personal computer, a personal digital assistant (PDA), an MP3 player, and the like. As another example, the target or receiver described herein may be, or may be included in, a terminal, such as a mobile terminal, a personal computer, a personal digital assistant (PDA), an MP3 player, and the like. As another example, the transmitter and/or the receiver may be a separate individual unit.

FIG. 1 illustrates an example of a wireless power transmission system.

As described herein, a wireless power transmitted using the wireless power transmission system may be referred to as resonance power.

Referring to FIG. 1, the wireless power transmission system includes a source-target structure including a source and a target. In this example, the wireless power transmission system includes a resonance power transmitter 110 corresponding to the source and a resonance power receiver 120 corresponding to the target.

The resonance power transmitter 110 includes a source unit 111 and a source resonator 115. The source unit 111 may receive energy from an external voltage supplier to generate a resonance power. The resonance power transmitter 110 may further include a matching control 113 to perform resonance frequency or impedance matching.

For example, the source unit 111 may include an alternating current (AC)-to-AC (AC/AC) converter, an AC-to-direct current (DC) (AC/DC) converter, a (DC/AC) inverter, and the like. The AC/AC converter may adjust, to a desired level, a signal level of an AC signal input from an external device. The AC/DC converter may output a DC voltage at a predetermined level by rectifying an AC signal output from the AC/AC converter. The DC/AC inverter may generate an AC signal of, for example, a few megahertz (MHz) to tens of MHz band by quickly switching a DC voltage output from the AC/DC converter.

The matching control 113 may set at least one of a resonance bandwidth of the source resonator 115 and an impedance matching frequency of the source resonator 115. Although not illustrated in FIG. 1, the matching control 113 may include at least one of a source resonance bandwidth setting unit and a source matching frequency setting unit. The source resonance bandwidth setting unit may set the resonance bandwidth of the source resonator 115. The source matching frequency setting unit may set the impedance matching frequency of the source resonator 115. For example, a Q-factor of the source resonator 115 may be determined based on the setting of the resonance bandwidth of the source resonator 115 and/or the setting of the impedance matching frequency of the source resonator 115.

The source resonator 115 may transfer electromagnetic energy to a target resonator 121. For example, the source resonator 115 may transfer resonance power to the resonance power receiver 120 through magnetic coupling 101 with the target resonator 121. The source resonator 115 may resonate within the set resonance bandwidth.

In this example, the resonance power receiver 120 includes the target resonator 121, a matching control 123 to perform resonance frequency or impedance matching, and a target unit 125 to transfer the received resonance power to a load.

The target resonator 121 may receive the electromagnetic energy from the source resonator 115. The target resonator 121 may resonate within the set resonance bandwidth.

The matching control 123 may set at least one of a resonance bandwidth of the target resonator 121 and an impedance matching frequency of the target resonator 121. Although not illustrated in FIG. 1, the matching control 123 may include at least one of a target resonance bandwidth setting unit and a target matching frequency setting unit. The target resonance bandwidth setting unit may set the resonance bandwidth of the target resonator 121. The target matching frequency setting unit may set the impedance matching frequency of the target resonator 121. For example, a Q-factor of the target resonator 121 may be determined based on the setting of the resonance bandwidth of the target resonator 121 and/or the setting of the impedance matching frequency of the target resonator 121.

The target unit 125 may transfer the received resonance power to the load. For example, the target unit 125 may include an AC/DC converter and a DC/DC converter. The AC/DC converter may generate a DC voltage by rectifying an AC signal transmitted from the source resonator 115 to the target resonator 121. The DC/DC converter may supply a rated voltage to a device or the load by adjusting a voltage level of the DC voltage.

For example, the source resonator 115 and the target resonator 121 may be configured in a helix coil structured resonator, a spiral coil structured resonator, a meta-structured resonator, and the like.

Referring to FIG. 1, a process of controlling the Q-factor may include setting the resonance bandwidth of the source resonator 115 and the resonance bandwidth of the target resonator 121, and transferring the electromagnetic energy from the source resonator 115 to the target resonator 121 through magnetic coupling 101 between the source resonator 115 and the target resonator 121. For example, the resonance bandwidth of the source resonator 115 may be set wider or narrower than the resonance bandwidth of the target resonator 121. For example, an unbalanced relationship between a bandwidth (BW)-factor of the source resonator 115 and a BW-factor of the target resonator 121 may be maintained by setting the resonance bandwidth of the source resonator 115 to be wider or narrower than the resonance bandwidth of the target resonator 121.

In a wireless power transmission system employing a resonance scheme, the resonance bandwidth may be an important factor. When the Q-factor considering all of a change in a distance between the source resonator 115 and the target resonator 121, a change in the resonance impedance, impedance mismatching, a reflected signal, and the like, is Qt, Qt may have an inverse-proportional relationship with the resonance bandwidth, as given by Equation 1.

$$\frac{\Delta f}{f_0} = \frac{1}{Qt} \quad \text{[Equation 1]}$$
$$= \Gamma_{S,D} + \frac{1}{BW_S} + \frac{1}{BW_D}$$

In Equation 1, $f_0$ denotes a central frequency, $\Delta f$ denotes a change in a bandwidth, $\Gamma_{S,D}$ denotes a reflection loss between the source resonator 115 and the target resonator 121, $BW_S$ denotes the resonance bandwidth of the source resonator 115, and $BW_D$ denotes the resonance bandwidth of the target resonator 121. For example, the BW-factor may indicate either $1/BW_S$ or $1/BW_D$.

Due to an external effect, impedance mismatching between the source resonator 115 and the target resonator 121 may occur. For example, a change in the distance between the source resonator 115 and the target resonator 121, a change in a location of at least one of the source resonator 115 and the target resonator 121, and the like, may cause impedance mismatching between the source resonator 115 and the target resonator 121 to occur. The impedance mismatching may be a direct cause in decreasing an efficiency of power transfer. When a reflected wave corresponding to a transmission signal that is partially reflected by the source and returned towards the target is detected, the matching control 113 may determine that impedance mismatching has occurred, and may perform impedance matching. For example, the matching control 113 may change a resonance frequency by detecting a resonance point through a waveform analysis of the reflected wave. The matching control 113 may determine, as the resonance frequency, a frequency that has a minimum amplitude in the waveform of the reflected wave.

For example, a resonator may be configured as a helix coil structured resonator, a spiral coil structured resonator, a meta-structured resonator, and the like.

All materials may have a unique magnetic permeability (Mμ) and a unique permittivity epsilon (ε). The magnetic permeability indicates a ratio between a magnetic flux density that occurs with respect to a given magnetic field in a corresponding material and a magnetic flux density that occurs with respect to the given magnetic field in a vacuum state. The magnetic permeability and the permittivity may determine a propagation constant of a corresponding material at a given frequency or at a given wavelength. An electromagnetic characteristic of the corresponding material may be determined based on the magnetic permeability and the permittivity.

For example, a material having a magnetic permeability or a permittivity absent in nature and artificially designed may be referred to as a metamaterial. The metamaterial may be easily disposed in a resonance state even in a relatively large wavelength area or a relatively low frequency area. For example, even though a material size rarely varies, the metamaterial may be easily disposed in the resonance state.

Figure 2:
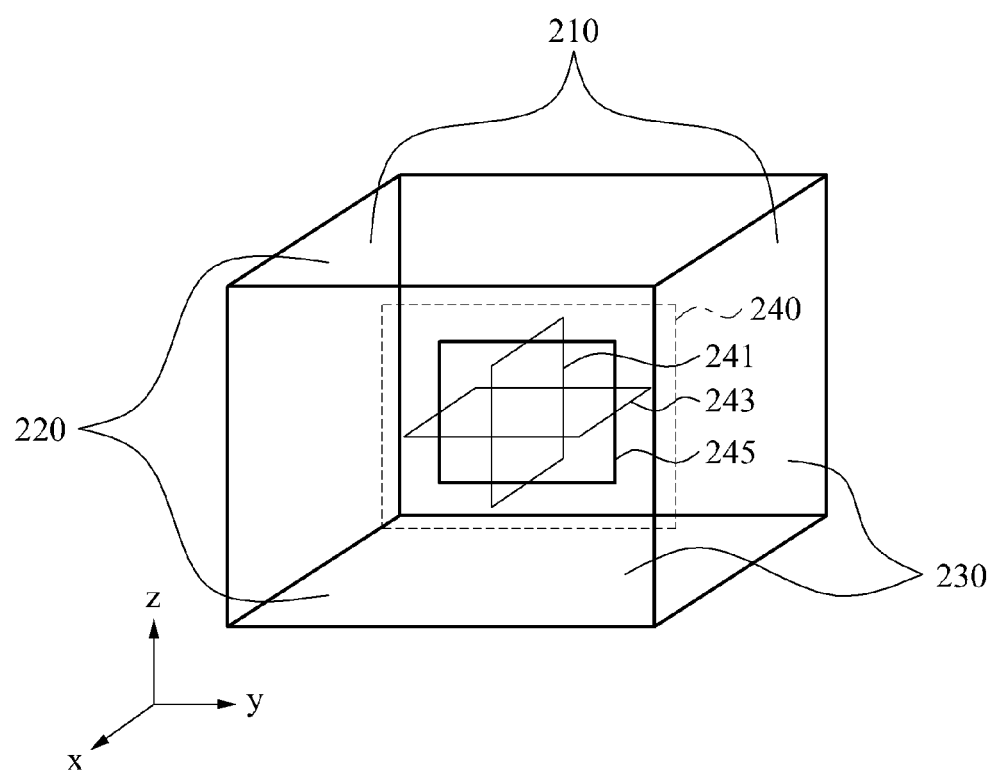
FIG. 2 is a diagram illustrating an example of a radiative wireless power transmitter and receiver.

FIG. 2 illustrates an example of a radiative wireless power transmitter and receiver.

A unit resonator may be in the form of an electrically closed loop. For example, the loop structure may include a circle, a polygon such as a square, and the like. A primary direction of a magnetic field may be formed to be vertical to a plane of the unit resonator. In wireless power transmission using a near field, a magnetic field in a vertical direction may occupy most of the formed magnetic field. Therefore, when a source resonator and a target resonator are orthogonal to each other, wireless power transmission may not be performed. In an environment in which the wireless power transmission is performed, the source resonator and the target resonator may be placed in an arbitrary direction to each other. The source resonator may perform wireless power transmission through resonating, with respect to the corresponding target resonator.

Referring to FIG. 2, the radiative wireless power transmitter and receiver includes first unit resonators 210, second unit resonators 220, third unit resonators 230, and a feeding unit 240.

For example, the first unit resonators 210 may form a magnetic field with a target resonator based on an x-axis direction and z-axis direction or XZ plane. The forming of the magnetic field with the target resonator based on the x-axis direction and z-axis direction indicates a magnetic field that is formed in parallel to the y-axis. The first unit resonators 210 may transmit resonance power to the target resonator through the magnetic field. In this example, the first unit resonators 210 may transmit power in a direction that is vertical to the XZ plane and that is parallel to the y-axis. In the radiative wireless power receiver, the first unit resonators 210 may form a magnetic field with a source resonator based on the direction of the x-axis and z-axis. The first unit resonators 210 may receive resonance power from the source resonator through the magnetic field. For example, the first unit resonators 210 may include at least two unit resonators that are parallel with the XZ plane.

As another example, the second unit resonators 220 may form a magnetic field with the target resonator based on an x-axis direction and y-axis direction or XY plane. The forming of the magnetic field with the target resonator based on the x-axis direction and y-axis direction indicates a magnetic field that is formed vertical to the XY plane and that is parallel to the direction of the z-axis. The second unit resonators 220 may transmit resonance power through the target resonator. In the radiative wireless power receiver, the second unit resonators 220 may form a magnetic field with the source resonator based on the direction of the x-axis and y-axis. The second unit resonators 220 may receive resonance power from the source resonator through the magnetic field. For example, the second unit resonators 220 may include at least two unit resonators that are parallel with the XY plane.

As another example, the third unit resonators 230 may form a magnetic field with the target resonator based on a y-axis direction and z-axis direction or YZ plane. The forming of the magnetic field with the target resonator based on the y-axis direction and z-axis direction indicates a magnetic field that is formed along a direction that is vertical to the YZ plane and that is parallel to the direction of the x-axis. The third unit resonators 230 may transmit resonance power to the target resonator through the magnetic field. In the radiative wireless power receiver, the third unit resonators 230 may form a magnetic field with the source resonator based on the direction of the y-axis and z-axis. The third unit resonators 230 may receive resonance power from the source resonator through the magnetic field. For example, the third unit resonators 230 may include at least two unit resonators that are parallel with the plane of the y-axis and z-axis.

The first unit resonators 210, the second unit resonators 220, and the third unit resonators 230 may be orthogonal to each other. In this example, the first unit resonators 210 may transmit power in a direction that is parallel to the y-axis, the second unit resonators 220 may transmit power in a direction that is parallel to the z-axis, and the third unit resonators 230 may transmit power in a direction that is parallel to the x-axis.

As an example, the unit resonator included in the first unit resonators 210, the second unit resonators 220, and the third unit resonators 230 may be in a square structure, and the unit resonators may be connected with each other to form a structure of a hexahedron of FIG. 2. In this example, a source resonator of the hexahedron structure may transmit resonance power to a target resonator located at the top, the bottom, the left, the right, the fore, and the rear of the hexahedron structure. Accordingly, wireless power transmission efficiency of the source resonator may be maintained regardless of a location of a target device including the target resonator because the resonators are capable of transmitting power in any direction from the wireless power transmitter.

The feeding unit 240 may control resonance power transmission that is performed by the first unit resonators 210, the second unit resonators 220, and the third unit resonators 230. For example, the feeding unit 240 may control current flowing through the first unit resonators 210, the second unit resonators 220, and the third unit resonators 230 to control the resonance power transmission. In the radiative wireless power receiver, the feeding unit 240 may control resonance power reception that is performed by the first unit resonators 210, the second unit resonators 220, and the third unit resonators 230. For example, the feeding unit 240 may control the current flowing through the first unit resonators 210, the second unit resonators 220, and the third unit resonators 230 to control the resonance power reception.

In this example, the feeding unit 240 includes a first matcher 241, a second matcher 243, and a third matcher 245. The first matcher 241 is placed in the XZ plane that is parallel with the first unit resonators 210. The first matcher 241 may enable the first unit resonators 210 to form a magnetic field with the target device. As another example, the first matcher 241 may enable the first unit resonators 210 to form a magnetic field with a source device.

In this example, the second matcher 243 is placed in the XY plane that is parallel with the second unit resonators 220. The second matcher 243 may enable the second unit resonators 230 to form a magnetic field with the target device. As another example, the second matcher 243 may enable the second unit resonators 220 to form a magnetic field with the source device.

In this example, the third matcher 245 is placed in the YZ plane that is parallel with the third unit resonators 230. The third matcher 245 may enable the third unit resonators 230 to form a magnetic device with the target device. As another example, the third matcher 245 may enable the third unit resonators 230 to form a magnetic field with the source device. In this example, the target device may include the target resonator and the source device may include the source resonator.

The feeding unit 240 may operate one of the first matcher 241, the second matcher 243, and the third matcher 245 to enable unit resonators that are placed in a plane parallel with each matcher to form a magnetic field. For example, the feeding unit 240 may operate a predetermined matcher to enable a unit resonator in a predetermined direction to form a magnetic field. Accordingly, wireless power transmission and wireless power reception may be performed in the predetermined direction.

Each matcher may perform magnetic coupling with a unit resonator that is placed in a plane parallel to a corresponding matcher. As a result, the matcher may enable the unit resonator to transmit or receive resonance power. The matcher may be configured as a resonance structure that is able to perform magnetic coupling. The matcher may control current flowing through the unit resonator that is placed in parallel with the matcher, and thus, may control the resonance power that is transmitted and/or received by the unit resonator.

Each of the first matcher 241, the second matcher 243, and the third matcher 245 may be a square structure. For example, each matcher may have the same shape as the unit resonator that is placed in a plane parallel to a corresponding matcher. The matcher may control resonance power transmission of the corresponding unit resonator through magnetic coupling, and an efficiency of the resonance power transmission may increase.

Figure 3A:
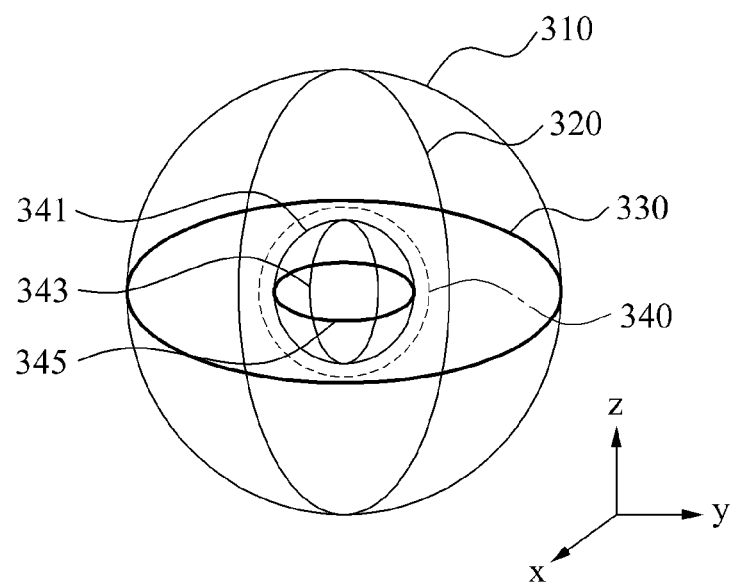
FIGS. 3A and 3B are diagrams illustrating additional examples of a radiative wireless power transmitter and receiver.
Figure 3B:
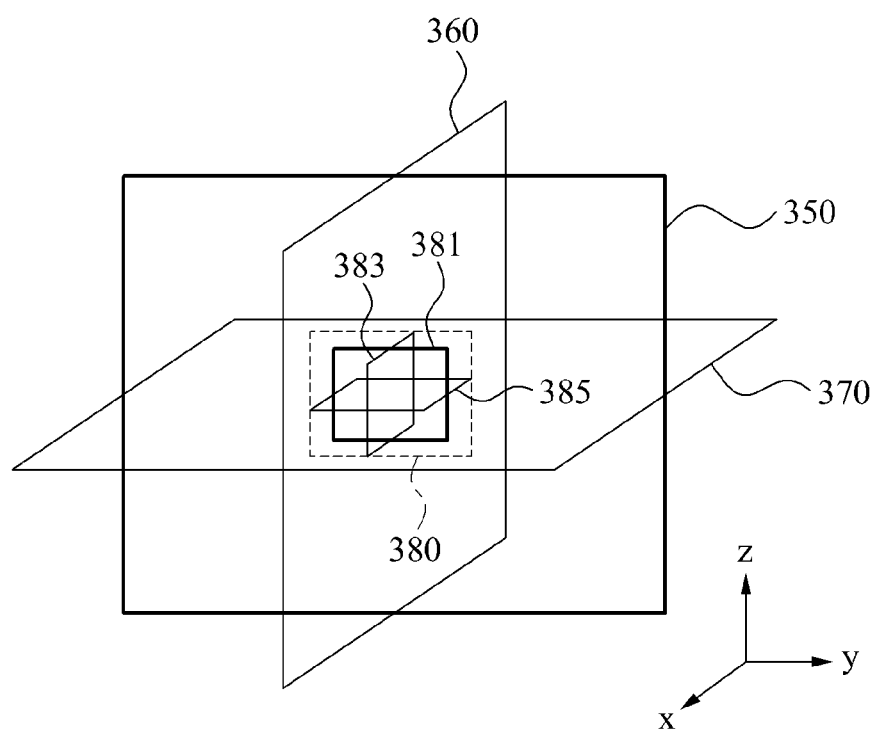

FIGS. 3A and 3B illustrate additional examples of a radiative wireless power transmitter and receiver.

In this example, the radiative wireless power transmitter and the radiative wireless power receiver include a first unit resonator, for example, first unit resonators 320 and 360, a second unit resonator, for example, second unit resonators 330 and 370, a third unit resonator, for example, third unit resonators 310 and 350, and a feeding unit, for example, feeding units 340 and 380.

In the radiative wireless power transmitter, the first unit resonators 320 and 360 are placed in parallel to a plane along the x-axis and the z-axis (XZ plane) and may form a magnetic field with a target resonator. The first unit resonators 320 and 360 may transmit resonance power to the target resonator through a magnetic field. In the radiative wireless power receiver, the first unit resonators 320 and 360 are placed in parallel to the XZ plane and may form a magnetic field with a source resonator. In this example, the magnetic field formed by the first unit resonators 320 and 360 is formed vertical to the XZ plane and along a direction that is parallel to the y-axis. The first unit resonator may receive resonance power from the source resonator through the magnetic field.

In the radiative wireless power transmitter, the second unit resonators 330 and 370 are placed in parallel to the plane along the x-axis and the y-axis (XY plane) and may form a magnetic field with the target resonator. The second unit resonators 330 and 370 may transmit resonance power to the target resonator through the magnetic field. In the radiative wireless power receiver, the second unit resonators 330 and 370 are placed in parallel to the XY plane and may form a magnetic field with the source resonator. In this example, the magnetic field formed by the second unit resonators 330 and 370 is formed vertical to the XY plane and along a direction that is parallel to the z-axis. The second unit resonator may receive resonance power from the source resonator through the magnetic field.

In the radiative wireless power transmitter, the third unit resonators 310 and 350 are placed in parallel to a plane along the y-axis and the z-axis (YZ plane) and may form a magnetic field with the target resonator. The third unit resonators 310 and 350 may transmit resonance power to the target resonator through the magnetic field. In the radiative wireless power receiver, the third unit resonators 310 and 350 are placed in parallel to the YZ plane and may form a magnetic field with the source resonator. In this example, the magnetic field formed by the third unit resonators 310 and 350 is formed vertical to the YZ plane and along a direction that is parallel to the x-axis. The third unit resonator may receive resonance power from the source resonator through the magnetic field.

The first unit resonators 320 and 360, the second unit resonators 330 and 370, and the third unit resonators 310 and 350 may be orthogonal to each other. In this example, the first unit resonators 320 and 360 may transmit power in a direction that is parallel to the y-axis, the second unit resonators 330 and 370 may transmit power in a direction that is parallel to the z-axis, and the third unit resonators 310 and 350 may transmit power in a direction that is parallel to the x-axis.

The first unit resonators 320 and 360, the second unit resonators 330 and 370, and the third unit resonators 310 and 350 may be in a structure of a polygon, respectively. Therefore, a unit resonator may be configured in a structure of a square or a circle. The source resonator in a polygon structure may transmit resonance power through magnetic coupling with a target resonator that is facing each unit resonator of the polygon structure. In this example, the efficiency of wireless power transmission of the source resonator may be maintained within a predetermined range, regardless of a location of a target device including the target resonator. In this example, the polygon structure may be a simpler structure than the hexahedron structure of FIG. 2, may perform the same function as the hexagon structure, and may maintain the efficiency of the wireless power transmission and reception.

In the radiative wireless power transmitter, the feeding units 340 and 380 may control the resonance power transmission performed by the first unit resonators 320 and 360, the second unit resonators 330 and 370, and the third unit resonators 310 and 350, respectively. The feeding units 340 and 380 may control current that flows through by the first unit resonators 320 and 360, the second unit resonators 330 and 370, and the third unit resonators 310 and 350, and thus, may control the resonance power transmission.

Also, in the radiative wireless power receiver, the feeding units 340 and 380 may control the resonance power reception performed by the first unit resonators 320 and 360, the second unit resonators 330 and 370, and the third unit resonators 310 and 350, respectively. The feeding units 340 and 380 may control current that flows through the first unit resonators 320 and 360, the second unit resonators 330 and 370, and the third unit resonators 310 and 350, and thus, may control the resonance power reception.

In this example, each of the feeding units 340 and 380, includes a first matcher, for example, first matchers 343 and 383, a second matcher, for example, second matchers 345 and 385, and a third matcher, for example, third matchers 341 and 381. The first matchers 343 and 383 may be located within the first unit resonators 320 and 360. In this example, the first matchers 343 and 383 are placed in the XZ plane that is parallel with the first unit resonator 320 and 360, respectively. The first matchers 343 and 383 may enable the first unit resonators 320 and 360 to form a magnetic field with the target device. The first matchers 343 and 383 may enable the first unit resonators 320 and 360 to form a magnetic field with the source device.

The second matchers 345 and 385 may be located within the second unit resonators 330 and 370. In this example, the second matchers 345 and 385 are placed in the XY plane that is parallel with the second unit resonators 330 and 370, respectively. The second matchers 345 and 385 may enable the second unit resonators 330 and 370 to form a magnetic field with the target device. The second matchers 345 and 385 may enable the second unit resonators 330 and 370 to form a magnetic field with the source device.

The third matchers 341 and 381 may be located within the third unit resonator 310 and 350. In this example, the third matchers 341 and 381 are placed in the YZ plane that is parallel with the third unit resonators 310 and 350, respectively. The third matchers 341 and 381 may enable the third unit resonators 310 and 350 to form a magnetic field with the target device. The third matchers 341 and 381 may enable the third unit resonators 310 and 350 to form a magnetic field with the source device.

The feeding units 340 and 380 may operate one of the first matcher 343 and 383, the second matcher 345 and 385, and the third matcher 341 and 381 to enable a unit resonator that is placed in a plane that is parallel with each matcher to form a magnetic field. In this example, the feeding units 340 and 380 may only operate a predetermined matcher to enable a unit resonator in a predetermined direction to form a magnetic field, and thus, wireless power transmission or reception may be performed in the predetermined direction.

Each matcher may perform magnetic coupling with a unit resonator that is placed in a plane that is parallel with a corresponding matcher, and thus, may enable the unit resonator to transmit or to receive resonance power. For example, the matcher may be configured as a resonance structure that is able to perform magnetic coupling. The matcher may control current that flows through the unit resonator placed in a plane that is parallel with the matcher, and thus, may control the resonance power transmitted or received by the unit resonator.

Each of the first matcher 343, the second matcher 345, and the third matcher 341 may be in a structure of a circle. Each matcher may be configured to have the same shape as a unit resonator placed in a plane that is parallel to a corresponding matcher. In this example, the matcher may control resonance power transmission of the corresponding unit resonator through magnetic coupling, and an efficiency of resonance power transmission may increase.

Figure 4:
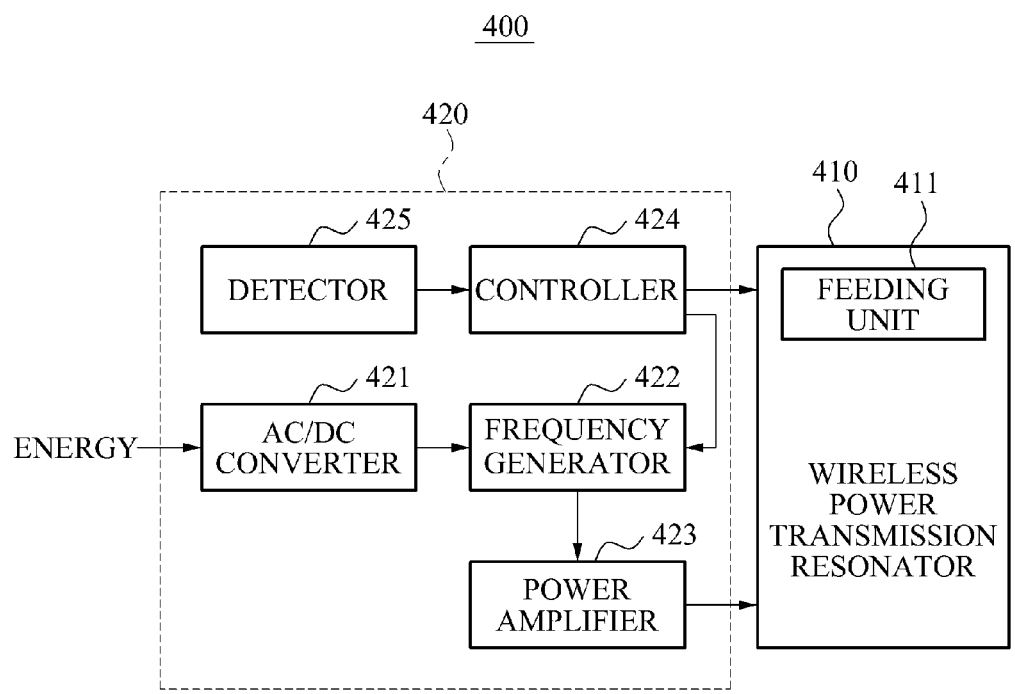
FIG. 4 is a diagram illustrating an example of a wireless power transmitter.

FIG. 4 illustrates an example of a wireless power transmitter that is applicable to the source of FIG. 1.

Referring to FIG. 4, the wireless power transmitter 400 includes a wireless power transmission resonator 410 and a pre-processor 420.

The wireless power transmission resonator 410 may be a resonator such as the example resonators described with reference to FIGS. 2, 3A, 3B, and 6 through 13, and power may be wirelessly transmitted by a wave that is propagated by the wireless power transmission resonator 410.

The pre-processor 420 may generate a current and a frequency to be used for wireless power transmission using energy that is supplied from an external and/or an internal power supply.

In this example, the pre-processor 420 includes an AC/DC converter 421, a frequency generator 422, a power amplifier 423, a controller 424, and a detector 425.

The AC/DC converter 421 may convert AC energy that is supplied from the power supply to DC energy or to a DC current. In this example, the frequency generator 422 may generate a desired frequency, for example, a desired resonance frequency, based on the DC energy or the DC current, and may generate a current of the desired frequency. In this example, the current of the desired frequency may be amplified by the amplifier 423.

The controller 424 may generate a control signal to control an impedance of the wireless power transmission resonator

410, and may control a frequency that is generated by the frequency generator 422. For example, an optimal frequency that maximizes a power transmission gain, a coupling effect, and the like, may be selected from among multiple frequency bands. The controller 424 may generate a control signal to control a feeding unit 411. The feeding unit 411 may control resonance power transmission of the wireless power transmission resonator 410. The feeding unit 411 may control current that flows through the wireless power transmission resonator 410 to control the resonance power transmission. The feeding unit 411 may control the resonance power transmission through magnetic coupling with the wireless power transmission resonator 410.

The detector 425 may detect various features. For example, the detector 425 may detect a distance between the wireless power transmission resonator 410 and a wireless power reception resonator of a wireless power receiver, a reflection coefficient of a wave that is radiated from the wireless power transmission resonator 410 to the wireless power reception resonator, a power transmission gain between the wireless power transmission resonator 410 and the wireless power reception resonator, a coupling efficiency between the wireless power transmission resonator 410 and the wireless power reception resonator, and the like.

In this example, the controller 424 may control the impedance of the wireless power transmission resonator 410 based on one or more of the distance, the reflection coefficient, the power transmission gain, the coupling efficiency, and the like, or may generate a control signal that controls the frequency generated by the frequency generator 422 based on any of the distance, the reflection coefficient, the power transmission gain, the coupling efficiency, and the like.

Figure 5:
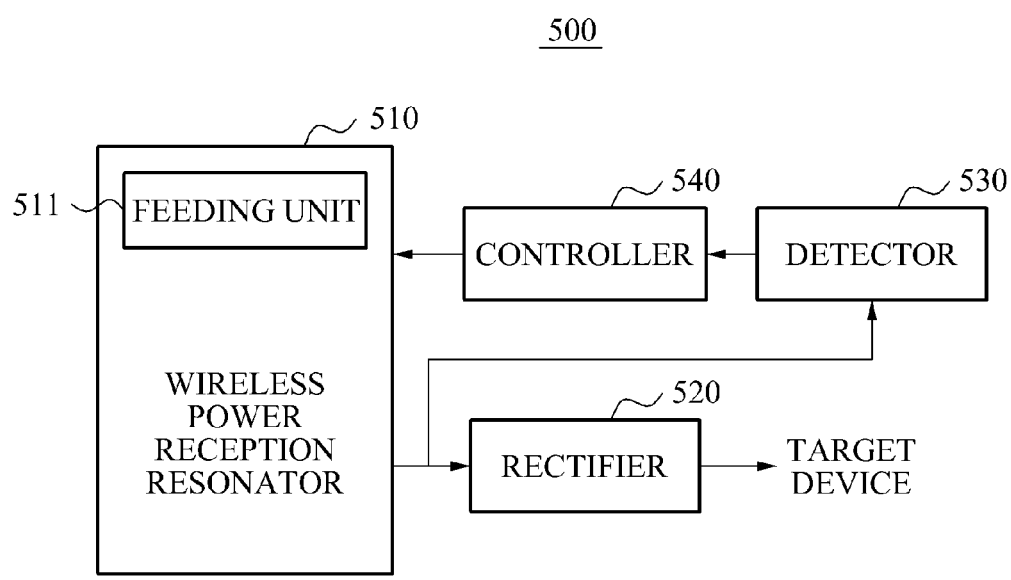
FIG. 5 is a diagram illustrating an example of a wireless power receiver.

FIG. 5 illustrates an example of a wireless power receiver that is applicable to the target of FIG. 1.

Referring to FIG. 5, the wireless power receiver 500 includes a wireless power reception resonator 510, a rectifier 520, a detector 530, and a controller 540.

The wireless power reception resonator 510 may be a resonator as described in the examples with reference to FIGS. 2, 3A, 3B, and 6 through 13, and may receive a wave that is propagated by a wireless power transmitter.

The rectifier 520 may convert power that is carried through the received wave to DC energy, and some or all of the DC energy may be provided to a target device.

The detector 530 may detect various features. For example, the detector 530 may detect a distance between a wireless power transmission resonator and the wireless power reception resonator 510 of the wireless power receiver 500, a reflection coefficient of a wave that is radiated from the wireless power transmission resonator 410 to the wireless power reception resonator 510, a power transmission gain between the wireless power transmission resonator 410 and the wireless power reception resonator 510, a coupling efficiency between the wireless power transmission resonator 410 and the wireless power reception resonator 510, and the like.

The controller 540 may generate a control signal to control an impedance of the wireless power reception resonator 510 based on one or more of the distance, the reflection coefficient, the power transmission gain, the coupling efficiency, and the like. The controller 540 may generate a signal to control a feeding unit 511. The feeding unit 511 may control resonance power reception of the wireless power reception resonator 510. The feeding unit 511 may control current that flows through the wireless power reception resonator 510 to control the resonance power reception. The feeding unit 511 may control the resonance power reception through magnetic coupling with the wireless power reception resonator 510.

Figure 6:
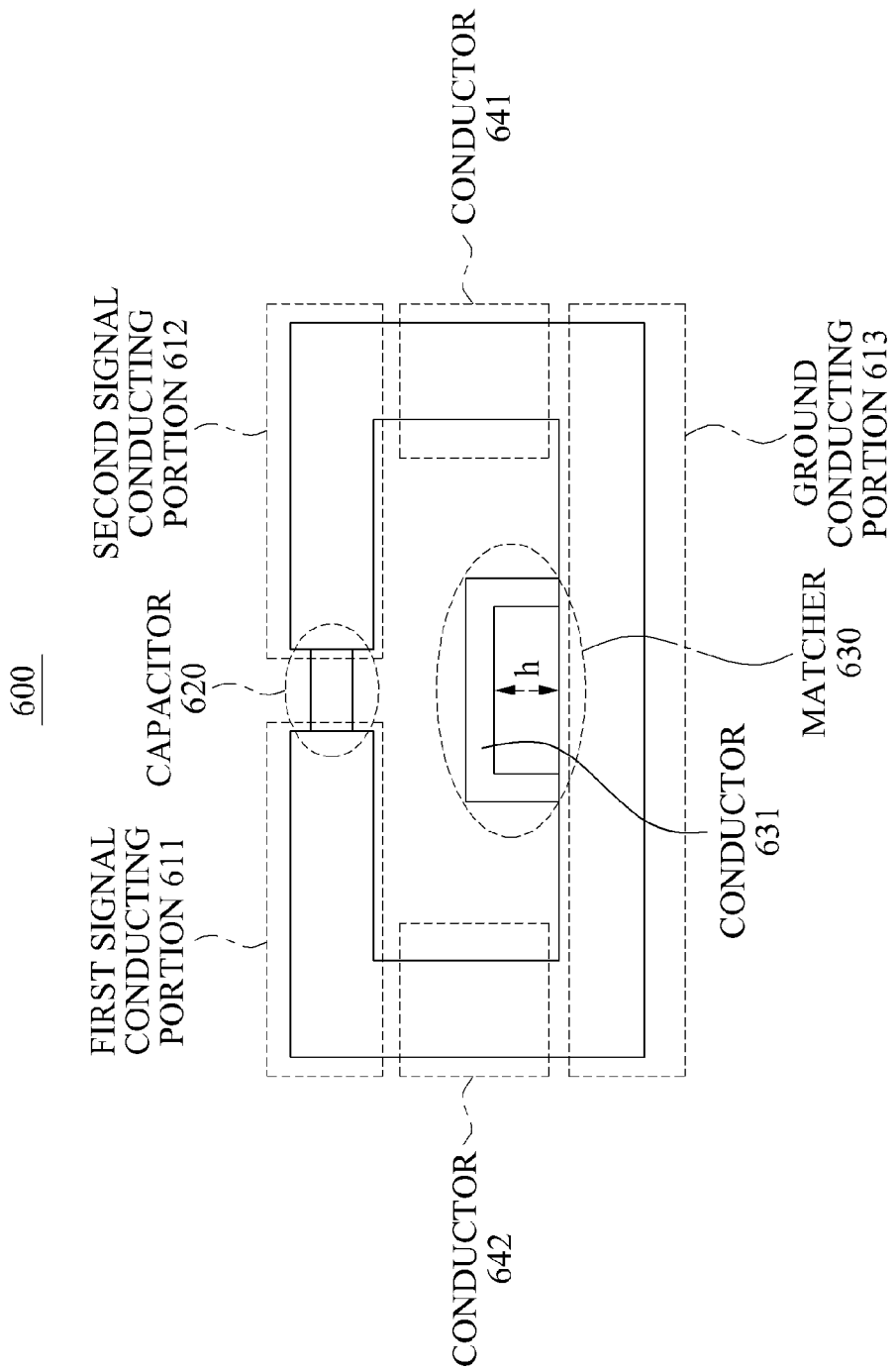
FIG. 6 is a diagram illustrating a two-dimensional (2D) example of a resonator.

FIG. 6 illustrates a two-dimensional (2D) example of a resonator.

Referring to FIG. 6, resonator 600 includes a transmission line, a capacitor 620, a matcher 630, and conductors 641 and 642. In this example, the transmission line includes a first signal conducting portion 611, a second signal conducting portion 612, and a ground conducting portion 613.

The capacitor 620 may be inserted in series between the first signal conducting portion 611 and the second signal conducting portion 612, and an electric field may be confined within the capacitor 620. For example, the transmission line may include at least one conductor in an upper portion of the transmission line, and may also include at least one conductor in a lower portion of the transmission line. Current may flow through the at least one conductor disposed in the upper portion of the transmission line, and the at least one conductor disposed in the lower portion of the transmission may be electrically grounded. In this example, a conductor disposed in an upper portion of the transmission line is referred to as the first signal conducting portion 611 and the second signal conducting portion 612. A conductor disposed in the lower portion of the transmission line is referred to as the ground conducting portion 613.

In this example, the transmission line includes the first signal conducting portion 611 and the second signal conducting portion 612 in the upper portion of the transmission line, and includes the ground conducting portion 613 in the lower portion of the transmission line. For example, the first signal conducting portion 611 and the second signal conducting portion 612 may be disposed such that they face the ground conducting portion 613. Current may flow through the first signal conducting portion 611 and the second signal conducting portion 612.

For example, one end of the first signal conducting portion 611 may be shorted to the conductor 642, and another end of the first signal conducting portion 611 may be connected to the capacitor 620. One end of the second signal conducting portion 612 may be grounded to the conductor 641, and another end of the second signal conducting portion 612 may be connected to the capacitor 620. Accordingly, the first signal conducting portion 611, the second signal conducting portion 612, the ground conducting portion 613, and the conductors 641 and 642 may be connected to each other, and the resonator 600 may have an electrically closed-loop structure. The term "loop structure" may include a polygonal structure, for example, a circular structure, a rectangular structure, and the like. In this example, "a loop structure" indicates a circuit that is electrically closed.

The capacitor 620 may be inserted into an intermediate portion of the transmission line. For example, the capacitor 620 may be inserted into a space between the first signal conducting portion 611 and the second signal conducting portion 612. The capacitor 620 may have various shapes, for example, a shape of a lumped element, a distributed element, and the like. For example, a distributed capacitor that has the shape of the distributed element may include zigzagged conductor lines and a dielectric material that has a relatively high permittivity between the zigzagged conductor lines.

When the capacitor 620 is inserted into the transmission line, the resonator 600 may have a property of a metamaterial. The metamaterial indicates a material that has a predetermined electrical property that is absent in nature and thus, may have an artificially designed structure. An electromagnetic characteristic of materials that exist in nature may have a unique magnetic permeability or a unique permittivity. Most materials may have a positive magnetic permeability or a positive permittivity. In the case of most materials, a right hand rule may be applied to an electric field, a magnetic field, and a pointing vector and thus, the corresponding materials may be referred to as right handed materials (RHMs).

However, a metamaterial has a magnetic permeability or a permittivity absent in nature, and thus, may be classified into, for example, an epsilon negative (ENG) material, a mu negative (MNG) material, a double negative (DNG) material, a negative refractive index (NRI) material, a left-handed (LH) material, and the like, based on a sign of the corresponding permittivity or magnetic permeability.

When a capacitance of the capacitor inserted as the lumped element is appropriately determined, the resonator 600 may have the characteristic of the metamaterial. Because the resonator 600 may have a negative magnetic permeability by adjusting the capacitance of the capacitor 620, the resonator 600 may also be referred to as an MNG resonator. Various criteria may be applied to determine the capacitance of the capacitor 620. For example, the various criteria may include a criterion for enabling the resonator 600 to have the characteristic of the metamaterial, a criterion for enabling the resonator 600 to have a negative magnetic permeability in a target frequency, a criterion for enabling the resonator 600 to have a zeroth order resonance characteristic in the target frequency, and the like. The capacitance of the capacitor 620 may be determined by at least one criterion.

The resonator 600, also referred to as the MNG resonator 600, may have a zeroth order resonance characteristic that has, as a resonance frequency, a frequency when a propagation constant is "0". For example, a zeroth order resonance characteristic may be a frequency transmitted through a line or medium that has a propogation constant of zero. Because the resonator 600 may have the zeroth order resonance characteristic, the resonance frequency may be independent with respect to a physical size of the MNG resonator 600. By appropriately designing the capacitor 620, the MNG resonator 600 may sufficiently change the resonance frequency. Accordingly, the physical size of the MNG resonator 600 may not be changed.

In a near field, the electric field may be concentrated on the capacitor 620 inserted into the transmission line. Accordingly, due to the capacitor 620, the magnetic field may become dominant in the near field. The MNG resonator 600 may have a relatively high Q-factor using the capacitor 620 of the lumped element and thus, it is possible to enhance an efficiency of power transmission. In this example, the Q-factor indicates a level of an ohmic loss or a ratio of a reactance with respect to a resistance in the wireless power transmission. It should be understood that the efficiency of the wireless power transmission may increase according to an increase in the Q-factor.

The MNG resonator 600 may include the matcher 630 for impedance matching. The matcher 630 may adjust the strength of a magnetic field of the MNG resonator 600. An impedance of the MNG resonator 600 may be determined by the matcher 630. For example, current may flow into and/or out of the MNG resonator 600 via a connector. The connector may be connected to the ground conducting portion 613 or the matcher 630. Power may be transferred through coupling without using a physical connection between the connector and the ground conducting portion 613 or the matcher 630.

For example, as shown in FIG. 6, the matcher 630 may be positioned within the loop formed by the loop structure of the resonator 600. The matcher 630 may adjust the impedance of the resonator 600 by changing the physical shape of the matcher 630. For example, the matcher 630 may include the conductor 631 for the impedance matching in a location that is separated from the ground conducting portion 613 by a distance h. Accordingly, the impedance of the resonator 600 may be changed by adjusting the distance h.

Although not illustrated in FIG. 6, a controller may be provided to control the matcher 630. In this example, the matcher 630 may change the physical shape of the matcher 630 based on a control signal generated by the controller. For example, the distance h between the conductor 631 of the matcher 630 and the ground conducting portion 613 may increase or decrease based on the control signal. Accordingly, the physical shape of the matcher 630 may be changed and the impedance of the resonator 600 may be adjusted. The controller may generate the control signal based on various factors, which is further described later.

As shown in FIG. 6, the matcher 630 may be a passive element such as the conductor 631. As another example, the matcher 630 may be an active element such as a diode, a transistor, and the like. When the active element is included in the matcher 630, the active element may be driven based on the control signal generated by the controller, and the impedance of the resonator 600 may be adjusted based on the control signal. For example, a diode that is a type of active element may be included in the matcher 630. The impedance of the resonator 600 may be adjusted depending on whether the diode is in an on state or in an off state.

Although not illustrated in FIG. 6, a magnetic core may pass through the MNG resonator 600. The magnetic core may increase the power transmission distance.

Figure 7:
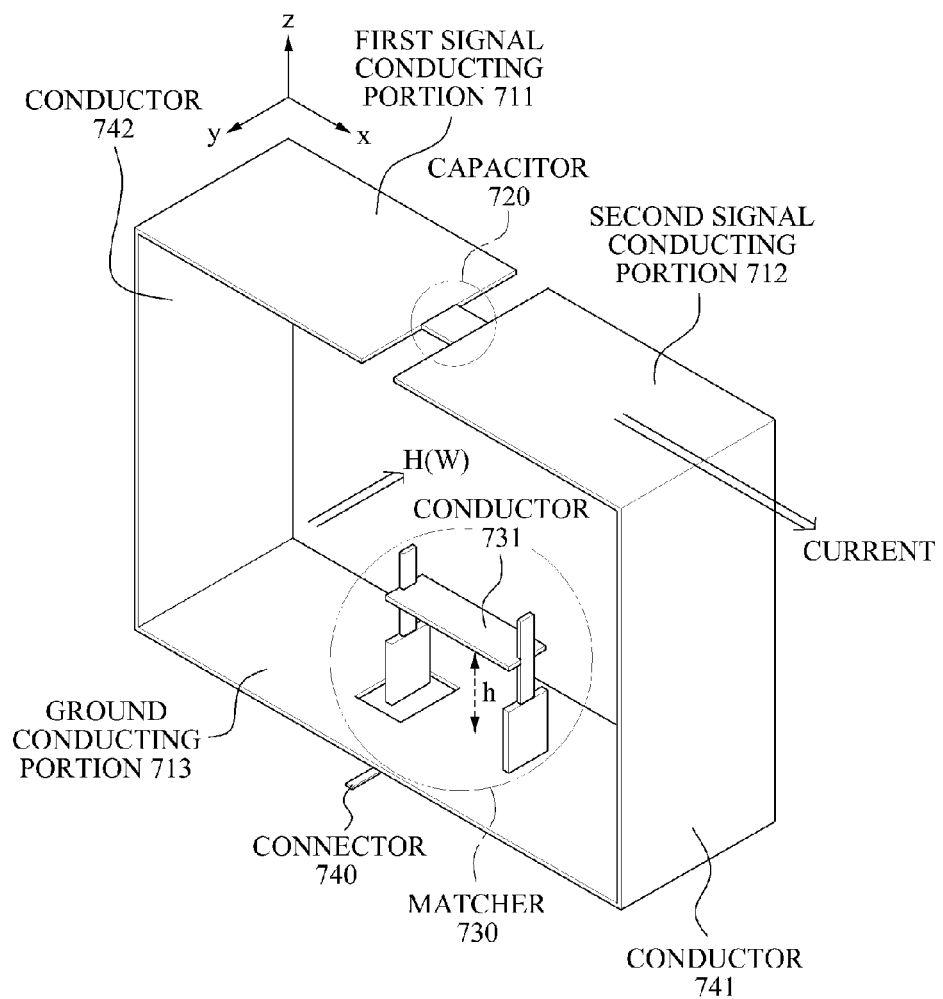
FIG. 7 is a diagram illustrating a three-dimensional (3D) example of a resonator.

FIG. 7 illustrates a three-dimensional (3D) example of a resonator.

Referring to FIG. 7, resonator 700 includes a transmission line and a capacitor 720. In this example, the transmission line includes a first signal conducting portion 711, a second signal conducting portion 712, and a ground conducting portion 713. The capacitor 720 may be inserted in series between the first signal conducting portion 711 and the second signal conducting portion 712 of the transmission line, and an electric field may be confined within the capacitor 720.

In this example, the transmission line includes the first signal conducting portion 711 and the second signal conducting portion 712 in an upper portion of the resonator 700, and includes the ground conducting portion 713 in a lower portion of the resonator 700. For example, the first signal conducting portion 711 and the second signal conducting portion 712 may be disposed such that they face the ground conducting portion 713. Current may flow in an x direction through the first signal conducting portion 711 and the second signal conducting portion 712. As a result of the current, a magnetic field H(W) may be formed in a −y direction. Alternatively, unlike the diagram of FIG. 7, the magnetic field H(W) may be formed in a +y direction.

One end of the first signal conducting portion 711 may be shorted to a conductor 742, and another end of the first signal conducting portion 711 may be connected to the capacitor 720. One end of the second signal conducting portion 712 may be grounded to a conductor 741, and another end of the second signal conducting portion 712 may be connected to the capacitor 720. Accordingly, the first signal conducting portion 711, the second signal conducting portion 712, the ground conducting portion 713, and the conductors 741 and 742 may be connected to each other such that the resonator 700 has an electrically closed-loop structure, as described with reference to FIG. 6.

As shown in FIG. 7, the capacitor 720 may be inserted between the first signal conducting portion 711 and the second signal conducting portion 712. For example, the capacitor 720 may be inserted into a space between the first signal conducting portion 711 and the second signal conducting portion 712. The capacitor 720 may have various shapes, for example, a shape of a lumped element, a distributed element, and the like. For example, a distributed capacitor that has the shape of the distributed element may include zigzagged conductor lines and a dielectric material that has a relatively high permittivity between the zigzagged conductor lines.

As the capacitor 720 is inserted into the transmission line, the resonator 700 may have a property of a metamaterial.

When a capacitance of the capacitor inserted as the lumped element is appropriately determined, the resonator 700 may have the characteristic of the metamaterial. Because the resonator 700 may have a negative magnetic permeability by adjusting the capacitance of the capacitor 720, the resonator 700 may also be referred to as an MNG resonator. Various criteria may be applied to determine the capacitance of the capacitor 720. For example, the various criteria may include a criterion for enabling the resonator 700 to have the characteristic of the metamaterial, a criterion for enabling the resonator 700 to have a negative magnetic permeability in a target frequency, a criterion enabling the resonator 700 to have a zeroth order resonance characteristic in the target frequency, and the like. The capacitance of the capacitor 720 may be determined based on one or more criterion.

The resonator 700, also referred to as the MNG resonator 700, may have a zeroth order resonance characteristic that has, as a resonance frequency, a frequency when a propagation constant is "0". Because the resonator 700 may have the zeroth order resonance characteristic, the resonance frequency may be independent with respect to a physical size of the MNG resonator 700. By appropriately designing the capacitor 720, the MNG resonator 700 may sufficiently change the resonance frequency. Accordingly, the physical size of the MNG resonator 700 may not be changed.

Referring to the MNG resonator 700 of FIG. 7, in a near field, the electric field may be concentrated on the capacitor 720 inserted into the transmission line. Accordingly, due to the capacitor 720, the magnetic field may become dominant in the near field. For example, because the MNG resonator 700 having the zeroth-order resonance characteristic may have characteristics similar to a magnetic dipole, the magnetic field may become dominant in the near field. A relatively small amount of the electric field formed due to the insertion of the capacitor 720 may be concentrated on the capacitor 720 and thus, the magnetic field may become further dominant.

Also, the MNG resonator 700 may include a matcher 730 for impedance matching. The matcher 730 may adjust the strength of magnetic field of the MNG resonator 700. An impedance of the MNG resonator 700 may be determined by the matcher 730. For example, current may flow into and/or out of the MNG resonator 700 via a connector 740. The connector 740 may be connected to the ground conducting portion 713 or the matcher 730.

For example, as shown in FIG. 7, the matcher 730 may be positioned within the loop formed by the loop structure of the resonator 700. The matcher 730 may adjust the impedance of the resonator 700 by changing the physical shape of the matcher 730. For example, the matcher 730 may include a conductor 731 for the impedance matching in a location that is separated from the ground conducting portion 713 by a distance h. Accordingly, the impedance of the resonator 700 may be changed by adjusting the distance h.

Although not illustrated in FIG. 7, a controller may be provided to control the matcher 730. In this example, the matcher 730 may change the physical shape of the matcher 730 based on a control signal generated by the controller. For example, the distance h between the conductor 731 of the matcher 730 and the ground conducting portion 713 may increase or decrease based on the control signal. Accordingly, the physical shape of the matcher 730 may be changed and the impedance of the resonator 700 may be adjusted.

The distance h between the conductor 731 of the matcher 730 and the ground conducting portion 713 may be adjusted using a variety of schemes. For example, a plurality of conductors may be included in the matcher 730 and the distance h may be adjusted by adaptively activating one of the conductors. As another example, the distance h may be adjusted by adjusting the physical location of the conductor 731 up and down. The distance h may be controlled based on the control signal of the controller. For example, controller may generate the control signal using various factors. An example of the controller generating the control signal will be described later.

As shown in FIG. 7, the matcher 730 may be a passive element such as the conductor 731. As another example, the matcher 730 may be an active element such as a diode, a transistor, and the like. When the active element is included in the matcher 730, the active element may be driven based on the control signal generated by the controller, and the impedance of the resonator 700 may be adjusted based on the control signal. For example, a diode that is a type of active element may be included in the matcher 730. The impedance of the resonator 700 may be adjusted depending on whether the diode is in an on state or in an off state.

Although not illustrated in FIG. 7, a magnetic core may pass through the resonator 700 configured as the MNG resonator. The magnetic core may increase the power transmission distance.

Figure 8:
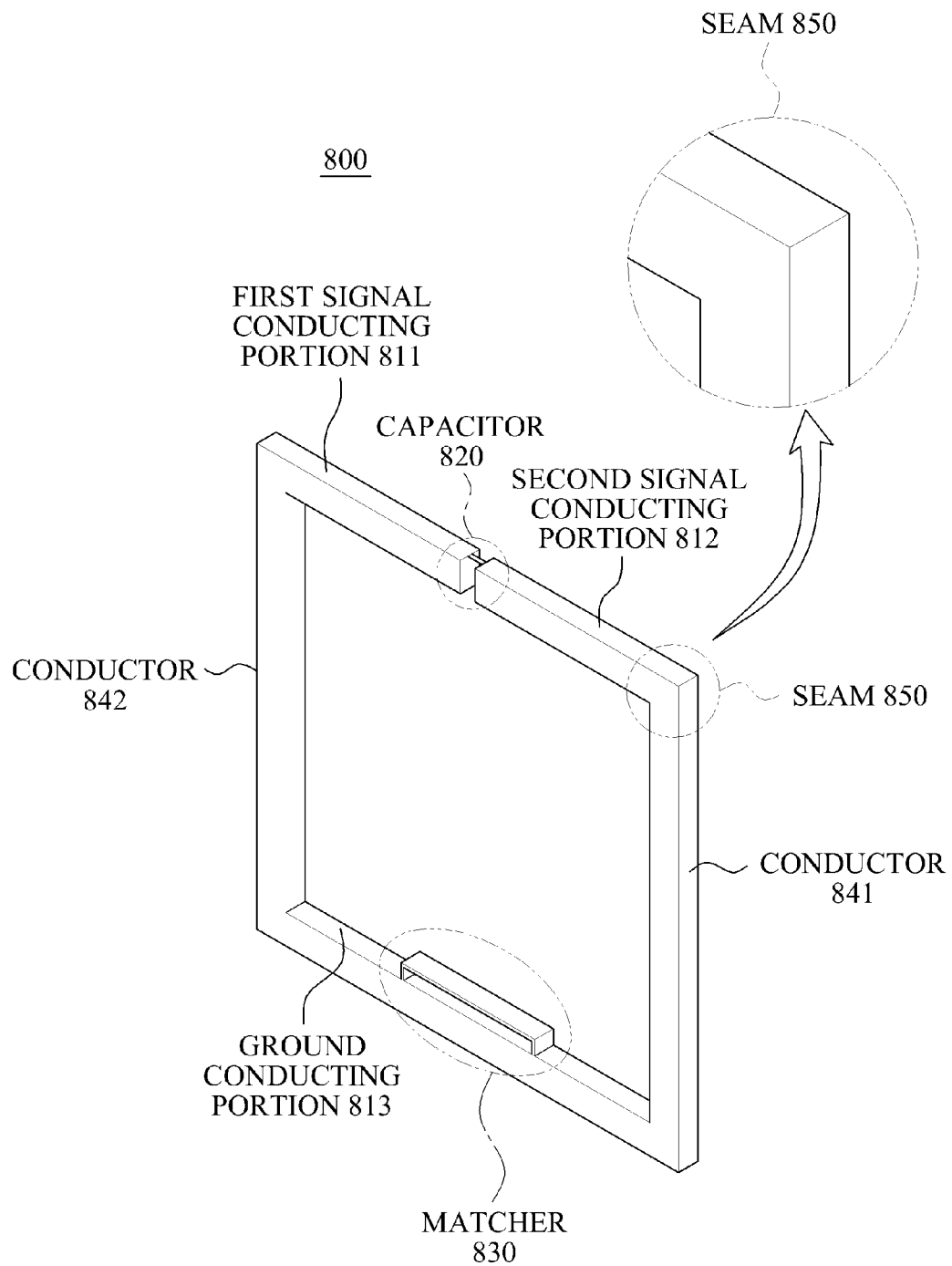
FIG. 8 is a diagram illustrating an example of a resonator for wireless power transmission configured as a bulky type.

FIG. 8 illustrates an example of a resonator for wireless power transmission configured as a bulky type.

Referring to FIG. 8, a first signal conducting portion 811 and a second signal conducting portion 812 may be integrally formed instead of being separately manufactured and later connected to each other. Similarly, the second signal conducting portion 812 and a conductor 841 may also be integrally manufactured.

When the second signal conducting portion 812 and the conductor 841 are separately manufactured and subsequently connected to each other, a loss of conduction may occur due to a seam 850. The second signal conducting portion 812 and the conductor 841 may be connected to each other without using a separate seam such that they are seamlessly connected to each other. Accordingly, it is possible to decrease a conductor loss caused by the seam 850. Accordingly, the second signal conducting portion 812 and a ground conducting portion 813 may be seamlessly and integrally manufactured. Similarly, the first signal conducting portion 811 and the ground conducting portion 813 may be seamlessly and integrally manufactured.

Referring to FIG. 8, a type of a seamless connection connecting at least two partitions into an integrated form is referred to as a bulky type.

Figure 9:
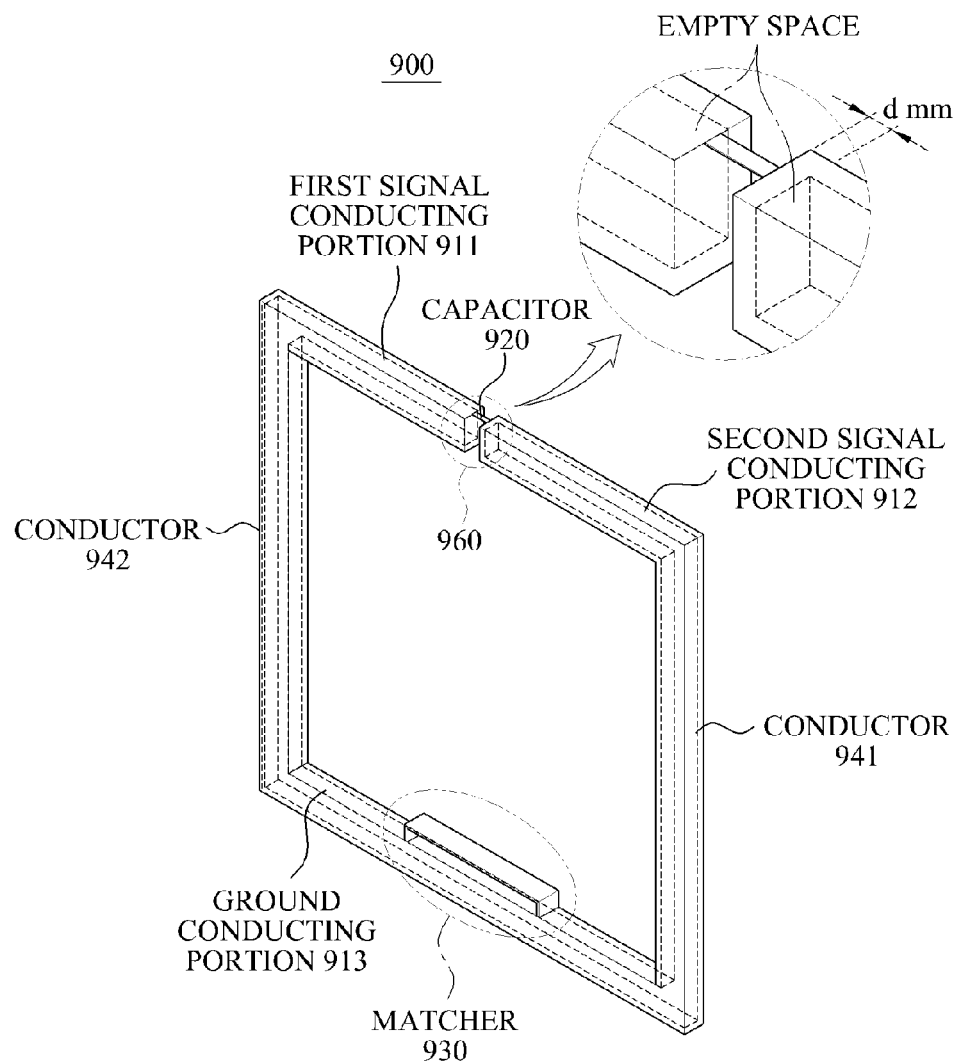
FIG. 9 is a diagram illustrating an example of a resonator for wireless power transmission configured as hollow type.

FIG. 9 illustrates an example of a resonator for wireless power transmission configured as a hollow type.

Referring to FIG. 9, each of a first signal conducting portion 911, a second signal conducting portion 912, a ground conducting portion 913, and conductors 941 and 942 of the resonator 900 configured as the hollow type include an empty space inside.

In a given resonance frequency, an active current may be modeled to flow in only a portion of the first signal conducting portion 911 instead of the entire first signal conducting portion 911, only a portion of the second signal conducting portion 912 instead of the entire second signal conducting portion 912, only a portion of the ground conducting portion 913 instead of the entire ground conducting portion 913, and only a portion of the conductors 941 and 942 instead of the entire conductors 941 and 942. For example, when a depth of each of the first signal conducting portion 911, the second signal conducting portion 912, the ground conducting portion 913, and the conductors 941 and 942 is significantly deeper than a corresponding skin depth in the given resonance frequency, it may be ineffective. The significantly deeper depth may increase a weight or manufacturing costs of the resonator 900.

Accordingly, in the given resonance frequency, the depth of each of the first signal conducting portion 911, the second signal conducting portion 912, the ground conducting portion 913, and the conductors 941 and 942 may be appropriately determined based on the corresponding skin depth of each of the first signal conducting portion 911, the second signal conducting portion 912, the ground conducting portion 913, and the conductors 941 and 942. When the first signal conducting portion 911, the second signal conducting portion 912, the ground conducting portion 913, and the conductors 941 and 942 have an appropriate depth that is deeper than a corresponding skin depth, the resonator 900 may become light, and manufacturing costs of the resonator 900 may also decrease.

For example, as shown in FIG. 9, the depth of the second signal conducting portion 912 may be determined as "d" mm and d may be determined according to $$d = \frac{1}{\sqrt{\pi f \mu \sigma}}.$$

In this example, f denotes a frequency, μ denotes a magnetic permeability, and σ denotes a conductor constant.

For example, if the first signal conducting portion 911, the second signal conducting portion 912, the ground conducting portion 913, and the conductors 941 and 942 are made of a copper and have a conductivity of $5.8 \times 10^7$ siemens per meter (S·m$^{-1}$), the skin depth may be about 0.6 mm with respect to 10 kHz of the resonance frequency and the skin depth may be about 0.006 mm with respect to 100 MHz of the resonance frequency.

Figure 10:
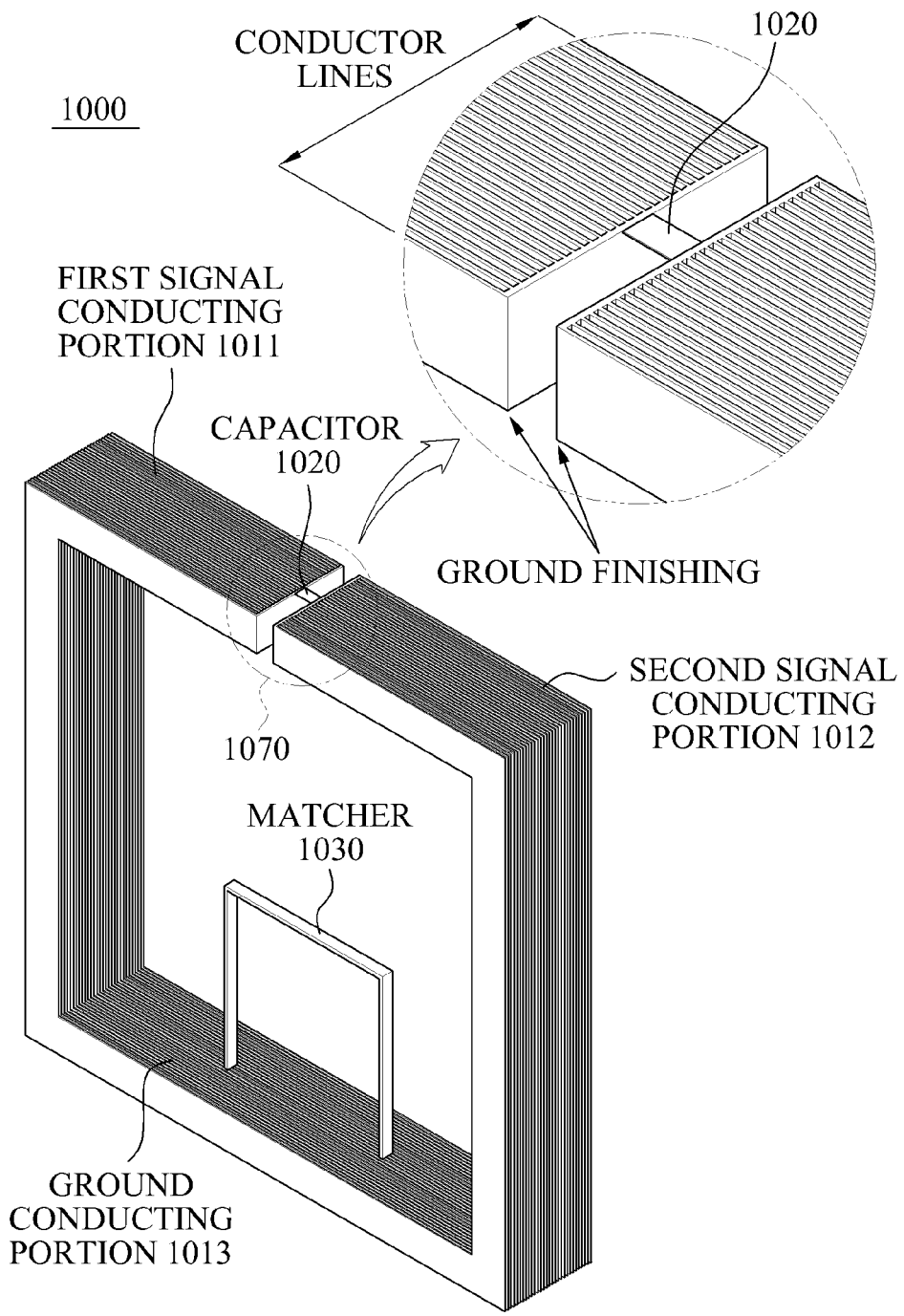
FIG. 10 is a diagram illustrating an example of a resonator for wireless power transmission using a parallel-sheet.

FIG. 10 illustrates an example of a resonator for a wireless power transmission using a parallel-sheet.

Referring to FIG. 10, the parallel-sheet may be applicable to each of a first signal conducting portion 1011 and a second signal conducting portion 1012 included in the resonator 1000.

For example, each of the first signal conducting portion 1011 and the second signal conducting portion 1012 may not be a perfect conductor, and thus, may have a resistance. Due to the resistance, an ohmic loss may occur. The ohmic loss may decrease a Q-factor and may also decrease a coupling effect.

By applying the parallel-sheet to each of the first signal conducting portion 1011 and the second signal conducting portion 1012, it is possible to decrease the ohmic loss, and to increase the Q-factor and the coupling effect. For example, referring to a portion 1070 indicated by a circle, when the parallel-sheet is applied, each of the first signal conducting portion 1011 and the second signal conducting portion 1012 may include a plurality of conductor lines. For example, the plurality of conductor lines may be disposed in parallel, and may be shorted at an end portion of each of the first signal conducting portion 1011 and the second signal conducting portion 1012.

As described above, when the parallel-sheet is applied to each of the first signal conducting portion 1011 and the second signal conducting portion 1012, the plurality of conductor lines may be disposed in parallel. Accordingly, a sum of resistances having the conductor lines may decrease. As a result, the resistance loss may decrease, and the Q-factor and the coupling effect may increase.

Figure 11:
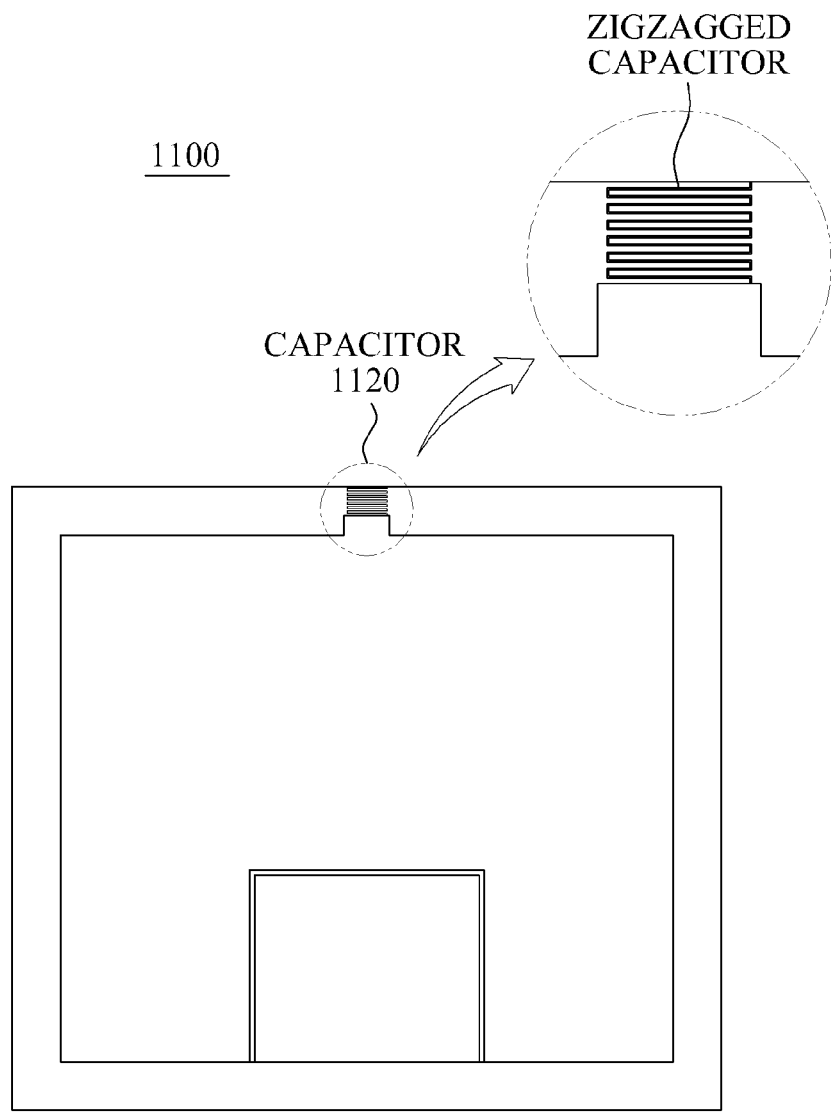
FIG. 11 is a diagram illustrating an example of a resonator for wireless power transmission including a distributed capacitor.

FIG. 11 illustrates an example of a resonator for a wireless power transmission that includes a distributed capacitor.

Referring to FIG. 11, a capacitor 1120 included in the resonator 1100 for the wireless power transmission may be a distributed capacitor. A capacitor as a lumped element may have a relatively high equivalent series resistance (ESR). A variety of schemes have been proposed to decrease the ESR contained in the capacitor of the lumped element. For example, by using the capacitor 1120 as a distributed element, it is possible to decrease the ESR. A loss caused by the ESR may decrease a Q-factor and a coupling effect.

As shown in FIG. 11, the capacitor 1120 as the distributed element may have a zigzagged structure. For example, the capacitor 1120 as the distributed element may be configured as a conductive line and a conductor having the zigzagged structure.

As shown in FIG. 11, by employing the capacitor 1120 as the distributed element, it is possible to decrease the loss that occurs due to the ESR. In addition, by disposing a plurality of capacitors as lumped elements, it is possible to decrease the loss that occurs due to the ESR. Because a resistance of each of the capacitors as the lumped elements decreases through a parallel connection, active resistances of parallel-connected capacitors as the lumped elements may also decrease and the loss that occurs due to the ESR may decrease. For example, by employing ten capacitors of 1 pF instead of using a single capacitor of 10 pF, it is possible to decrease the loss occurring due to the ESR.

Figure 12A:
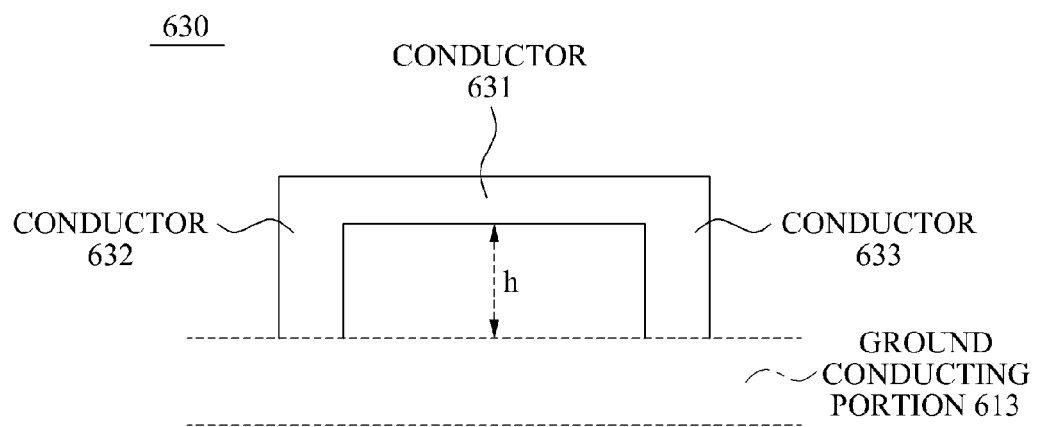
FIG. 12A is a diagram illustrating an example of a matcher used by the resonator of FIG. 6.
Figure 12B:
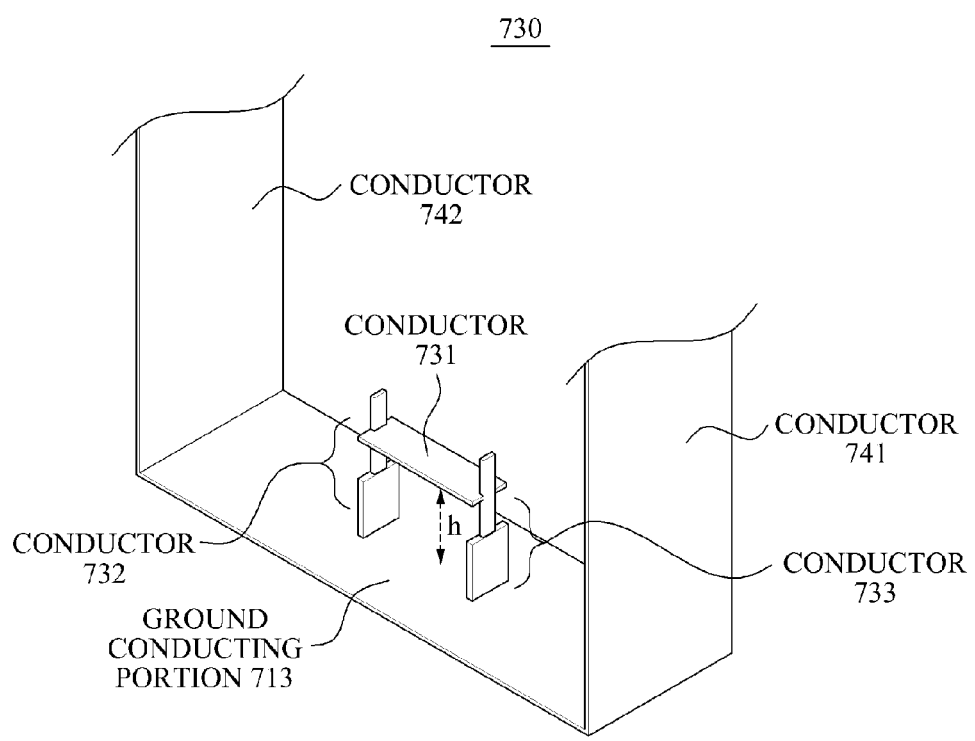
FIG. 12B is a diagram illustrating an example of a matcher used by the resonator of FIG. 7.

FIG. 12A illustrates an example of the matcher 630 used in the resonator 600 of FIG. 6, and FIG. 12B illustrates an example of the matcher 730 used in the resonator 700 of FIG. 7.

FIG. 12A illustrates a portion of the resonator including the matcher 630, and FIG. 12B illustrates a portion of the resonator including the matcher 730.

Referring to FIG. 12A, the matcher 630 includes a conductor 631, a conductor 632, and a conductor 633. The conductors 632 and 633 may be connected to the ground conducting portion 613 and the conductor 631. The impedance of the 2D resonator may be determined based on a distance h between the conductor 631 and the ground conducting portion 613. The distance h between the conductor 631 and the ground conducting portion 613 may be controlled by the controller. For example, the distance h between the conductor 631 and the ground conducting portion 613 may be adjusted using a variety of schemes. For example, the variety of schemes may include a scheme of adjusting the distance h by adaptively activating one of the conductors 631, 632, and 633, a scheme of adjusting the physical location of the conductor 631 up and down, and the like.

Referring to FIG. 12B, the matcher 730 includes a conductor 731, a conductor 732, and a conductor 733. The conductors 732 and 733 may be connected to the ground conducting portion 713 and the conductor 731. The conductors 732 and 733 may be connected to the ground conducting portion 713 and the conductor 731. The impedance of the 3D resonator may be determined based on a distance h between the conductor 731 and the ground conducting portion 713. For example, the distance h between the conductor 731 and the ground conducting portion 713 may be controlled by the controller. Similar to the matcher 630 included in the 2D resonator illustration, in the matcher 730 included in the 3D resonator illustration, the distance h between the conductor 731 and the ground conducting portion 713 may be adjusted using a variety of schemes. For example, the variety of schemes may include a scheme of adjusting the distance h by adaptively activating one of the conductors 731, 732, and 733, a scheme of adjusting the physical location of the conductor 731 up and down, and the like.

Although not illustrated in FIGS. 12A and 12B, the matcher may include an active element. A scheme of adjusting an impedance of a resonator using the active element may be similar as described above. For example, the impedance of the resonator may be adjusted by changing a path of current flowing through the matcher using the active element.

Figure 13:
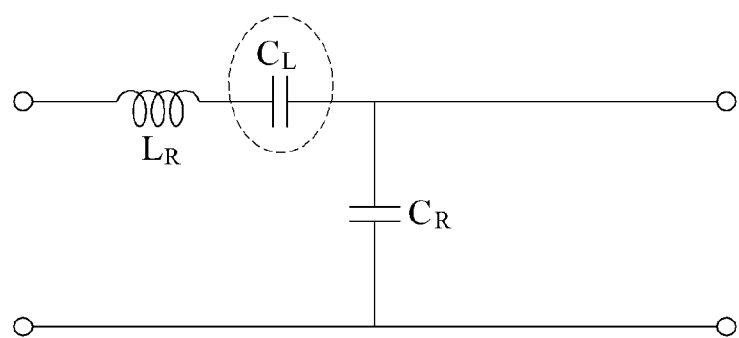
FIG. 13 is a diagram illustrating an example of an equivalent circuit of the resonator for wireless power transmission of FIG. 6.

FIG. 13 illustrates an example of an equivalent circuit of the resonator 600 for wireless power transmission of FIG. 6.

The resonator 600 for the wireless power transmission may be modeled to the equivalent circuit of FIG. 13. In the equivalent circuit of FIG. 13, $C_L$ denotes a capacitor that is inserted in a form of a lumped element in the middle of the transmission line of FIG. 6.

In this example, the resonator 600 may have a zeroth resonance characteristic. For example, when a propagation constant is "0", the resonator 600 may be assumed to have $\omega_{MZR}$ as a resonance frequency. The resonance frequency $\omega_{MZR}$ may be expressed by Equation 2.

$$\omega_{MZR} = \frac{1}{\sqrt{L_R C_L}} \qquad [\text{Equation 2}]$$

In Equation 2, MZR denotes a Mu zero resonator.

Referring to Equation 2, the resonance frequency $\omega_{MZR}$ of the resonator 600 may be determined by $L_R/C_L$. A physical size of the resonator 600 and the resonance frequency $\omega_{MZR}$ may be independent with respect to each other. Because the physical sizes are independent with respect to each other, the physical size of the resonator 600 may be sufficiently reduced.

The processes, functions, methods, and/or software described herein may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules that are recorded, stored, or fixed in one or more computer-readable storage media, in order to perform the operations and methods described above, or vice versa. In addition, a computer-readable storage medium may be distributed among computer systems connected through a network and computer-readable codes or program instructions may be stored and executed in a decentralized manner.

As a non-exhaustive illustration only, the terminal device described herein may refer to mobile devices such as a cellular phone, a personal digital assistant (PDA), a digital camera, a portable game console, an MP3 player, a portable/personal multimedia player (PMP), a handheld e-book, a portable laptop personal computer (PC), a global positioning system (GPS) navigation, and devices such as a desktop PC, a high definition television (HDTV), an optical disc player, a setup box, and the like, capable of wireless communication or network communication consistent with that disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer.

It should be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of example embodiments have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A radiative wireless power transmitter, comprising:
   first unit resonators configured to form a magnetic field with a target resonator based on an x-axis direction and a z-axis direction, and to transmit a resonance power to the target resonator;
   second unit resonators configured to form a magnetic field with the target resonator based on the x-axis direction and a y-axis direction, and to transmit a resonance power to the target resonator;
   third unit resonators configured to form a magnetic field with the target resonator based on the y-axis direction and the z-axis direction, and to transmit a resonance power to the target resonator; and
   a feeding unit configured to control resonance power transmission of the first unit resonators, the second unit resonators, and the third unit resonators,
   wherein the feeding unit comprises:
   a first matcher that is placed in a plane that is parallel with the first unit resonators and that is configured to enable the at least two first unit resonators to form the magnetic field with the at resonator,
   a second matcher that is placed in a plane that is parallel with the second unit resonators and that is configured to enable the second unit resonators to form the magnetic field with the tar et resonator, and a third matcher that is placed in parallel with the third unit resonators and that is configured to enable the third unit resonators to form the magnetic field with the target resonator.

2. The radiative wireless power transmitter of claim 1, wherein the feeding unit is configured to control a predetermined matcher from among the first matcher, the second matcher, and the third matcher, to enable wireless power transmission to be performed in a predetermined direction.

3. The radiative wireless power transmitter of claim 1, wherein the first unit resonators, the second unit resonators, and the third unit resonators each comprise:
  a transmission line that comprises a first signal conducting portion, a second signal conducting portion, and a ground conducting portion corresponding to the first signal conducting portion and the second signal conducting portion;
  a first conductor that is electrically connected to the first signal conducting portion and the ground conducting portion;
  a second conductor that is electrically connected to the second signal conducting portion and the ground conducting portion; and
  at least one capacitor inserted between the first signal conducting portion and the second signal conducting portion in series with respect to a current flowing through the first signal conducting porting and the second signal conducting portion.

4. The radiative wireless power transmitter of claim 1, further comprising:
  a controller configured to generate a control signal to control the resonance power transmission of the first unit resonators, the second unit resonators, and the third unit resonators, and to generate a control signal to control impedances of the first unit resonators, the second unit resonators, and the third unit resonators.

5. The radiative wireless power transmitter of claim 1, wherein the first unit resonators, the second unit resonators, and the third unit resonators are each in the shape of a square, and the first unit resonators, the second unit resonators, and the third unit resonators are connected with each other to form a shape of a hexahedron.

6. The radiative wireless power transmitter of claim 1, wherein the first matcher, the second matcher, and the third matcher are each in the shape of a square.

7. A radiative wireless power transmitter, comprising:
  a first unit resonator that is placed in a plane that is parallel to a direction of an x-axis and a z-axis, configured to form a magnetic field with a target resonator, and to transmit resonance power to the target resonator;
  a second unit resonator that is placed in a plane that is parallel to a direction of the x-axis and a y-axis, configured to form a magnetic field with the target resonator, and to transmit resonance power to the target resonator;
  a third unit resonator that is placed in a plane that is parallel to a direction of the y-axis and the z-axis, configured to form a magnetic field with the target resonator, and to transmit resonance power to the target resonator; and
  a feeding unit configured to control resonance power transmission of the first unit resonator, the second unit resonator, and the third unit resonator,
  wherein the feeding unit comprises:
  a first matcher included in the first unit resonator and configured to enable the first unit resonator to form the magnetic field with the tar et resonator;
  a second matcher included in the second unit resonator and configured to enable the second unit resonator to form the magnetic field with the target resonator; and
  a third matcher included in the third unit resonator and configured to enable the third unit resonators to form the magnetic field with the target resonator.

8. The radiative wireless power transmitter of claim 7, wherein the feeding unit is configured to control a predetermined matcher from among the first matcher, the second matcher, and the third matcher, to enable wireless power transmission to be performed in a predetermined direction.

9. The radiative wireless power transmitter of claim 7, wherein each of the first unit resonator, the second unit resonator, and the third unit resonator is in the shape of a circle, and the first unit resonator, the second unit resonator, and the third unit resonator are connected with each other to form a shape of a sphere.

10. The radiative wireless power transmitter of claim 7, wherein each of the first matcher, the second matcher, and the third matcher is in the shape of a circle.

11. The radiative wireless power transmitter of claim 7, further comprising:
  a controller configured to generate a control signal to control the resonance power transmission of the first unit resonator, the second unit resonator, and the third unit resonator, and to generate a control signal to control impedances of the first unit resonator, the second unit resonator, and the third unit resonator.

12. A radiative wireless power receiver, comprising:
  first unit resonators configured to form a magnetic field with a source resonator based on an x-axis direction and z-axis direction, and to receive resonance power from the source resonator;
  second unit resonators configured to form a magnetic field with the source resonator based on the x-axis direction and a y-axis direction, and to receive resonance power from the source resonator;
  third unit resonators configured to form a magnetic field with the source resonator based on the y-axis direction and the z-axis direction, and to receive resonance power from the source resonator; and
  a feeding unit configured to control resonance power reception of the first unit resonators, the second unit resonators, and the third unit resonators,
  wherein the feeding unit controls a predetermined matcher from among a first matcher, a second matcher, and a third matcher, to enable wireless power reception to be performed in a predetermined direction.

13. The radiative wireless power receiver of claim 12, further comprising:
  a detector configured to detect at least one of a distance between a wireless power transmission resonator and a wireless power reception resonator, a reflection coefficient of a wave emitted from the wireless power transmission resonator to the wireless power reception resonator, a power transmission gain between the wireless power transmission resonator and the wireless power reception resonator, and a coupling efficiency.

14. A radiative wireless power receiver, comprising:
  a first unit resonator that is placed in a plane that is parallel to a direction of an x-axis and a z-axis and is configured to form a magnetic field with a source resonator, and receiving resonance power from the source resonator;
  a second unit resonator that is placed in a plane that is parallel to a direction of the x-axis and a y-axis and is configured to form a magnetic field with the source resonator, and receiving resonance power from the source resonator;

a third unit resonator that is placed in a plane that is parallel to a direction of the y-axis and the z-axis and is configured to form a magnetic field with the source resonator, and receiving resonance power from the source resonator; and a feeding unit configured to control resonance power reception of the first unit resonator, the second unit resonator, and the third unit resonator, wherein the feeding unit controls a predetermined matcher from among a first matcher a second matcher, and a third matcher to enable wireless power reception to be performed in a predetermined direction.

15. A resonator for wireless power transmission, the resonator comprising:

a first resonating unit positioned in an XZ plane and configured to transmit/receive power wirelessly in a direction that is vertical to the XZ plane and that is parallel to the y-axis;

a second resonating unit positioned in an XY plane and configured to transmit/receive power wirelessly in a direction that is vertical to the XY plane and that is parallel to the z-axis;

a third resonating unit positioned in a YZ plane and configured to transmit/receive power wirelessly in a direction that is vertical to the YZ plane and that is parallel to the y-axis;

a first matcher that is positioned in the XZ plane along a transmission path of the first resonating unit;

a second matcher that is positioned in the XY plane along a transmission path of the second resonating unit; and a third matcher that is positioned in the YZ plane along a transmission path of the third resonating unit, wherein the first matcher, the second matcher, and the third matcher are each configured to control a respective resonating unit to enable the respective resonating unit to perform magnetic coupling with a target device.

* * * * *